US012057487B2

(12) United States Patent
Liaw

(10) Patent No.: US 12,057,487 B2
(45) Date of Patent: Aug. 6, 2024

(54) MEMORY CHIP STRUCTURE HAVING GAA TRANSISTORS WITH DIFFERENT THRESHOLD VOLTAGES AND WORK FUNCTIONS FOR IMPROVING PERFORMANCES IN MULTIPLE APPLICATIONS

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/357,761

(22) Filed: Jul. 24, 2023

(65) Prior Publication Data
US 2023/0369434 A1    Nov. 16, 2023

Related U.S. Application Data

(63) Continuation of application No. 17/712,401, filed on Apr. 4, 2022, now Pat. No. 11,757,014, which is a
(Continued)

(51) Int. Cl.
*H01L 29/423*    (2006.01)
*H01L 27/02*    (2006.01)
(Continued)

(52) U.S. Cl.
CPC .... *H01L 29/42392* (2013.01); *H01L 27/0207* (2013.01); *H01L 29/0673* (2013.01);
(Continued)

(58) Field of Classification Search
CPC ........... H01L 29/42392; H01L 27/0207; H01L 29/0673; H01L 29/1033; H01L 29/495;
(Continued)

(56) References Cited

U.S. PATENT DOCUMENTS 8,236,267 B2    8/2012    Hashimoto et al.
8,772,109 B2    7/2014    Colinge
(Continued)

*Primary Examiner* — Michael Jung
(74) *Attorney, Agent, or Firm* — HAYNES AND BOONE, LLP

(57) ABSTRACT

An exemplary semiconductor memory chip includes a first static random access memory (SRAM) cell and a second SRAM cell. The first SRAM cell has a first GAA transistor, and the second SRAM cell has a second GAA transistor. The first and the second SRAM cells have a same cell size, and the first and the second GAA transistors are of a same transistor type. Moreover, the first GAA transistor has a first threshold voltage and the second GAA transistor has a second threshold voltage. The second threshold voltage is different than the first threshold voltage. Furthermore, the first GAA transistor has a first gate stack and the second GAA transistor has a second gate stack. The first gate stack has a first work function value, and the second gate stack has a second work function value. The second work function value is different than the first work function value.

20 Claims, 10 Drawing Sheets

Related U.S. Application Data continuation of application No. 16/837,823, filed on Apr. 1, 2020, now Pat. No. 11,296,202.

(51) Int. Cl.
*H01L 29/06* (2006.01)
*H01L 29/10* (2006.01)
*H01L 29/49* (2006.01)
*H01L 29/51* (2006.01)
*H10B 10/00* (2023.01)

(52) U.S. Cl.
CPC ........ *H01L 29/1033* (2013.01); *H01L 29/495* (2013.01); *H01L 29/4966* (2013.01); *H01L 29/517* (2013.01); *H10B 10/12* (2023.02); *H10B 10/18* (2023.02)

(58) Field of Classification Search
CPC ... H01L 29/4966; H01L 29/517; H10B 10/12; H10B 10/18
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wann et al. |
| 8,860,148 B2 | 10/2014 | Hu et al. |
| 9,105,490 B2 | 8/2015 | Wang et al. |
| 9,236,300 B2 | 1/2016 | Liaw |
| 9,520,482 B1 | 12/2016 | Chang et al. |
| 9,576,814 B2 | 2/2017 | Wu et al. |
| 9,640,540 B1* | 5/2017 | Liaw .................... G11C 11/419 |
| 2014/0061814 A1 | 3/2014 | Kim et al. |
| 2015/0187763 A1 | 7/2015 | Kim et al. |
| 2017/0125408 A1 | 5/2017 | Park et al. |
| 2020/0185383 A1* | 6/2020 | Kim .................... H01L 29/402 |
| 2020/0365602 A1 | 11/2020 | Yang et al. |
| 2020/0411515 A1 | 12/2020 | Kim et al. |

* cited by examiner

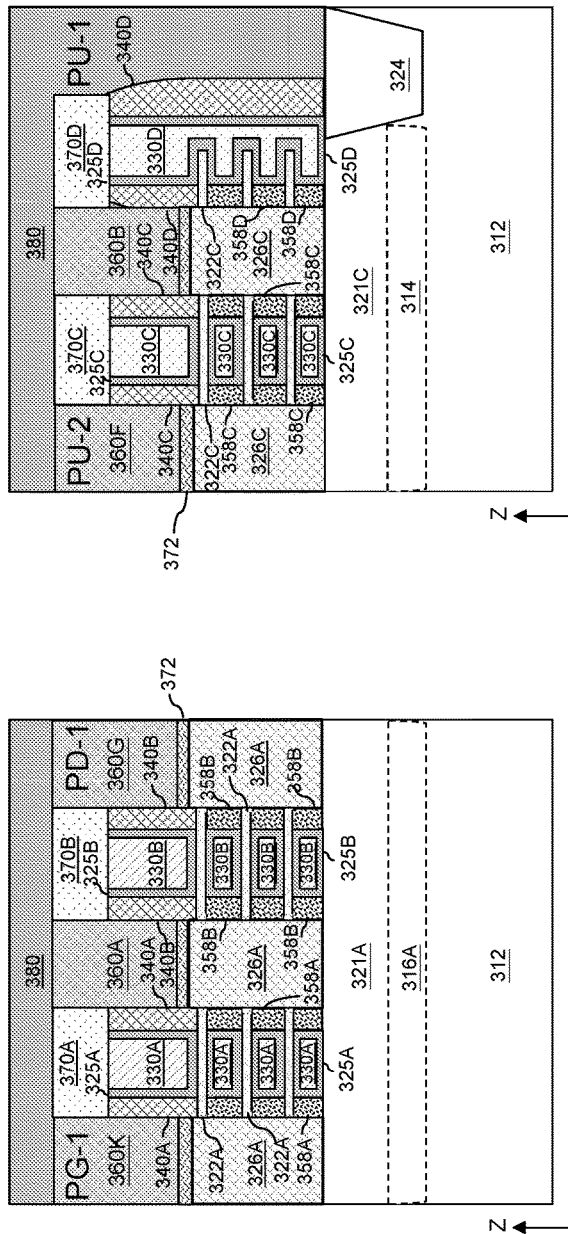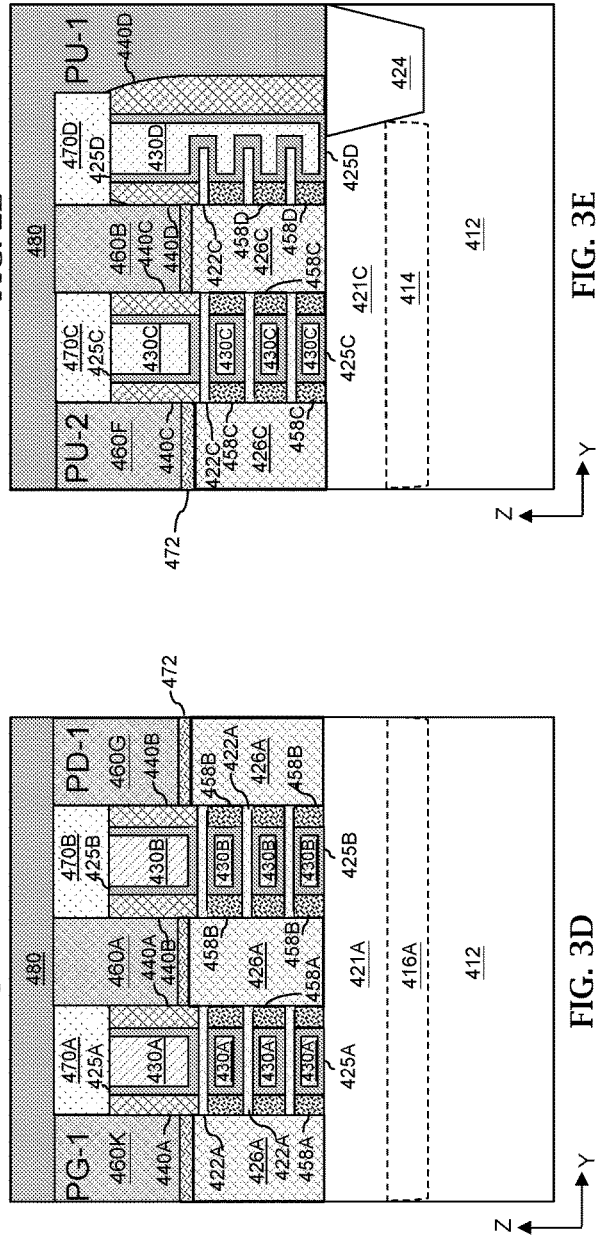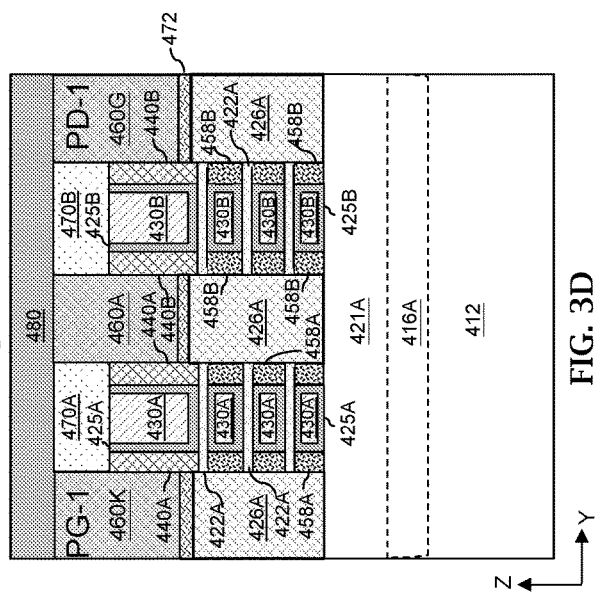

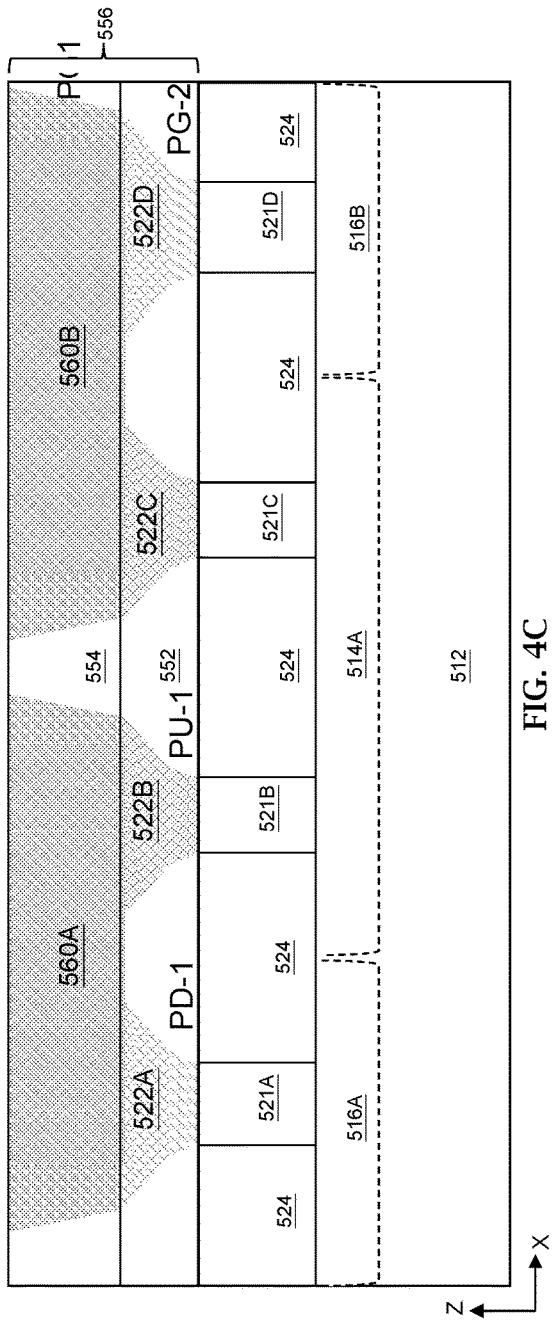
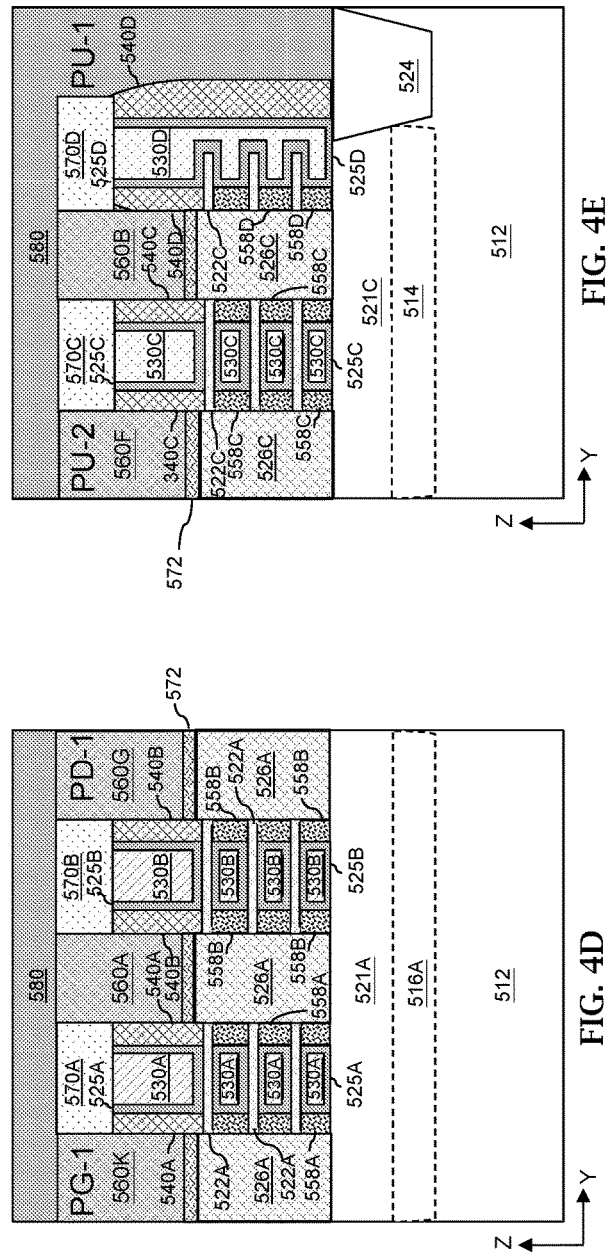
FIG. 4C
FIG. 4D
FIG. 4E

MEMORY CHIP STRUCTURE HAVING GAA TRANSISTORS WITH DIFFERENT THRESHOLD VOLTAGES AND WORK FUNCTIONS FOR IMPROVING PERFORMANCES IN MULTIPLE APPLICATIONS

PRIORITY DATA

This application is a continuation application of U.S. patent application Ser. No. 17/712,401, filed Apr. 4, 2022, which is a continuation application of U.S. patent application Ser. No. 16/837,823, filed Apr. 1, 2020, each of which is herein incorporated by reference in its entirety.

BACKGROUND

Static random access memory (SRAM) generally refers to any memory or storage that can retain stored data only when power is applied. SRAM chips may be used towards a variety of different applications requiring different performance characteristics. As integrated circuit (IC) technologies progress towards smaller technology nodes, gate-all-around (GAA) transistors have been incorporated into SRAMs to reduce chip footprint while maintaining reasonable processing margins. However, designing SRAM chips that include GAA transistors for multiple applications involves complex processes and is often particularly costly. Accordingly, although existing SRAM technologies have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2E are fragmentary diagrammatic views of a first single-port SRAM cell, which can be implemented in a memory chip, according to various aspects of the present disclosure.

FIGS. 3A-3E are fragmentary diagrammatic views of a second single-port SRAM cell, which can be implemented in a memory chip, according to various aspects of the present disclosure.

FIGS. 4A-4E are fragmentary diagrammatic views of a third single-port SRAM cell, which can be implemented in a SRAM memory chip, according to various aspects of the present disclosure.

DETAILED DESCRIPTION

Figure 1A:
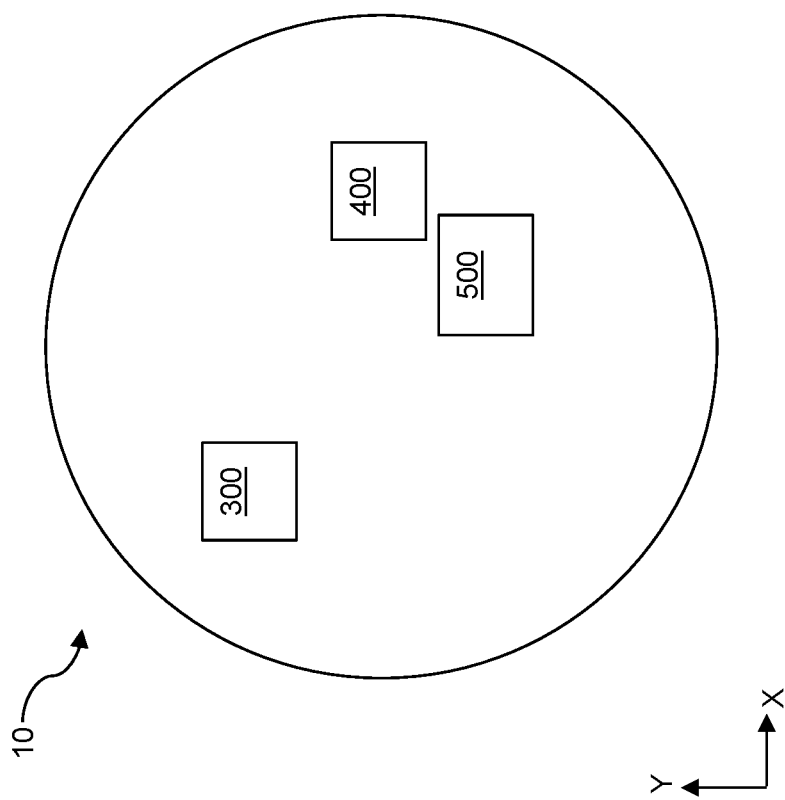
FIG. 1A is a diagrammatic plan view of a memory chip, in portion or entirety, according to various aspects of the present disclosure.

The present disclosure relates generally to integrated circuit (IC) devices, and more particularly, to semiconductor memory chips for multiple applications.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, memory chips, such as memory chips based on static random access memory (SRAM) cells, may be designed to achieve different performance characteristics for a variety of different applications. Such applications may include low-power applications, high-speed applications, superhigh-speed applications, and so on. For each of these applications, it is desirable to achieve both high performance and low leakage with one single memory chip. As technologies progress towards smaller technology nodes (for example, 20 nm, 16 nm, 10 nm, 7 nm, 5 nm, and below), the co-optimization of performance characteristics is increasingly limited by the competing demands for spaces from structures dedicated for each application. As a result, designing multi-application memory chips with optimized performances has become an increasingly challenging task. For example, a memory chip optimized for low leakage applications typically adopts transistors that include a single fin. On the other hand, a memory chip optimized for high-speed applications may require multiple fins to achieve the required current. Therefore, it is challenging to design multi-application memory chips without sacrificing performances.

Recently, gate-all-around (GAA) transistors have become a popular and promising architecture for building high-density memory chips. However, GAA transistors have complex structures which makes designing multi-application GAA-based memory chips even more complex and costly. The present disclosure thus proposes improved memory chip structures that include GAA-based memory cells. For example, as described herein, a memory chip may include multiple GAA-based memory cells, each memory cell configured to have specific performance characteristics tailored for a different application. Each memory cell may share similar structures, although each may be separately adjusted for optimized performances for their separate applications. Accordingly, the memory chip may offer optimized performance characteristics in different applications by invoking different memory cells on the same memory chip. This approach thus enables simplified design of memory chips without sacrificing performances in any intended applications. The present disclosure includes multiple embodiments. Different embodiments may have different advantages, and no particular advantage is necessarily required of any embodiment.

FIG. 1A is a diagrammatic plan view of a memory chip 10, in portion or entirety, according to various aspects of the present disclosure. In the depicted embodiment, memory chip 10 includes static random access memory (SRAM) cells, thus is also referred to as SRAM chip 10. However, the present disclosure contemplates embodiments, where memory chip 10 includes another type of memory, such as a dynamic random access memory (DRAM), a non-volatile random access memory (NVRAM), a flash memory, or other suitable memory. Memory chip 10 may be included in a microprocessor, a memory, and/or other IC device. In some implementations, memory chip 10 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The memory chip 10 includes an SRAM cell 300, an SRAM cell 400, and optionally an SRAM cell 500. SRAM cells 300, 400, and 500 (if present) may each be designed for a different application. For example, SRAM cell 300 may be designed for a first application, such as a high-speed application. Accordingly, SRAM cell 300 may be configured to have physical dimensions and material compositions optimized for the high-speed application. High-speed applications generally refer to applications in which the SRAM memory cell operates at a speed exceeding 1 GHz (for example, about 1 GHz to about 3 GHz) at working condition. Exemplary high-speed applications include level-1 (L1) and level-2 (L2) cache memory, for example, for microprocessors at gigahertz operations. SRAM cell 400 may be designed for a second application, such as a low-power application. Accordingly, SRAM cell 400 may be configured to have physical dimensions and material compositions optimized for the low-power application. Low-power applications generally refer to applications where the leakage current of the SRAM cell at standby condition is about 1 pA to about 50 pA, such that the power consumption may be minimized. Exemplary low-power applications include level-3 (L3) cache memory, for example, for mobile phones and computers with large density requirements. Therefore, the memory chip 10 may include two different SRAM cells, each of which is optimized for a different application, and each of which may be separately invoked as needed. Accordingly, the single memory chip 10 may be used in two separate applications without sacrificing its performance in either application. Additionally, the memory chip 10 may further include SRAM cell 500, which may be designed for a third application, such as a superhigh-speed application. Accordingly, SRAM cell 500 may be configured to have physical dimensions and material compositions suitable for the superhigh-speed application. Superhigh-speed applications generally refer to applications in which the SRAM memory cell operates at a speed exceeding 2 GHz (for example, about 2 GHz to about 6 GHz) at working condition. Exemplary superhigh-speed applications include High Performance Computing (HPC) L1 cache products. Therefore, the memory chip 10 may include three different SRAM cells, each of which is optimized for a different application, and each of which may be separately invoked as needed. Accordingly, the single memory chip 10 may be used in three separate applications without sacrificing its performance in any of three applications. Furthermore, the different SRAM cells 300, 400, and 500 (if present) may also perform other functions not described. FIG. 1A has been simplified for the sake of clarity to better understand the inventive concepts of the present disclosure. Additional features can be added in memory chip 10, and some of the features described below can be replaced, modified, or eliminated in other embodiments of memory chip 10.

SRAM cells 300, 400, and 500 (if present) may be positioned in any relative position from one another within SRAM chip 10. For example, SRAM cells 300 and 400 may be adjacent to each other, such that they share a portion of a cell boundary line. SRAM cells 300 and 400 may further be positioned in any relative orientation with respect to each other. In some embodiments, where SRAM cells 300 and 400 are of rectangular shapes, they may share a border corresponding to their longer dimensions (length), or a border corresponding to their shorter dimensions (width). Alternatively, SRAM cell 300 may share a portion of border along its longer dimension with a portion of border of SRAM cell 400 along its shorter dimension. Furthermore, SRAM cells 300 and 400 may be positioned away from each other, such that SRAM cells 300 and 400 do not share any portion of their cell boundary lines. Similarly, SRAM cells 300 and 400 may be positioned in any relative orientations with respect to each other when they are spaced apart. In some embodiments, the memory chip 10 further includes SRAM cell 500. SRAM cell 500 may be positioned adjacent to or spaced away from one or both of SRAM cells 300 and 400. SRAM cell 500 may be positioned in any relative orientation with respect to either of SRAM cells 300 and 400. Each of SRAM cells 300, 400, and 500 may be a part of a same memory array or different memory arrays. Therefore, when SRAM cells 300, 400, and/or 500 are adjacent to one another, they may be memory cells on the borders of their respective memory arrays.

Figure 1B:
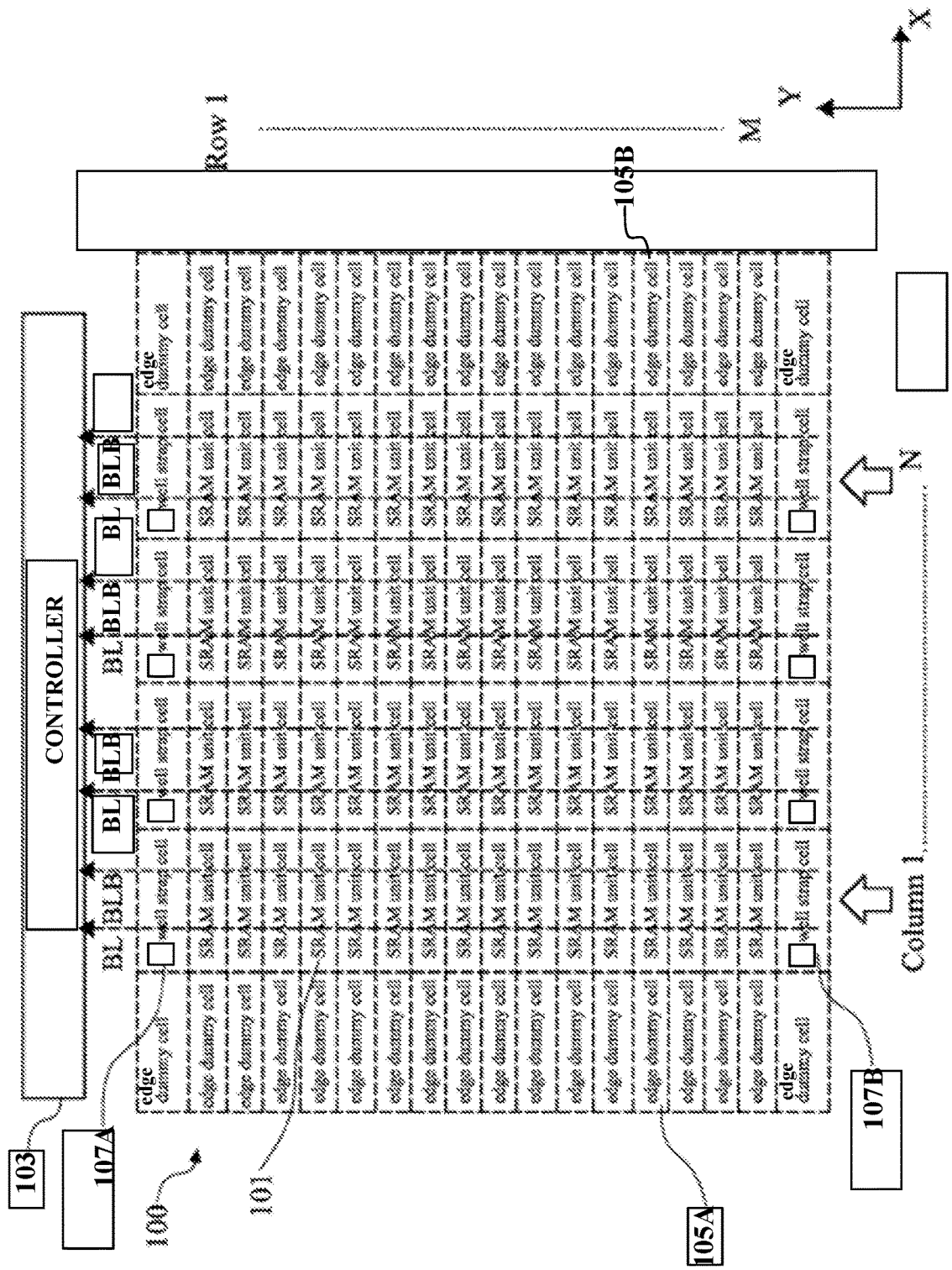
FIG. 1B is a diagrammatic plan view of a SRAM array, in portion or entirety, according to various aspects of the present disclosure.

An exemplary memory array is illustrated in FIG. 1B. FIG. 1B is a diagrammatic plan view of a memory array 100, in portion or entirety, according to various aspects of the present disclosure. FIG. 1B has been simplified for the sake of clarity to better understand the inventive concepts of the present disclosure. Additional features can be added in memory array 100, and some of the features described below can be replaced, modified, or eliminated in other embodiments of memory array 100.

Memory array 100 includes memory cells 101, such as SRAM memory cells, configured to store data. In some embodiments, memory cells 101 are SRAM cells 300, SRAM cells 400, or SRAM cells 500. In some embodiments, memory cells 101 are a combination of SRAM cells 300, SRAM cells 400, and/or SRAM cells 500. In some implementations, memory cells 101 include various p-type transistors and/or n-type transistors. Memory cells 101 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 101 in true form and complementary form on a column-by-column basis. Row 1 to row M each includes a word line (WL) (not shown) that facilitates access to respective memory cells 101 on a row-by-row basis. Each memory cell 101 is electrically connected to a respective BL, a respective BLB, and a respective WL, which are electrically connected to a controller 103. Controller 103 is configured to generate one or more signals to select at least one WL and at least one bit line pair (here, BL and BLB) to access at least one of memory cells 101 for read operations and/or write operations. Controller 103 includes any circuitry suitable to facilitate read/write operations from/to memory cells 101, including but not limited to, a column decoder circuit, a row decoder circuit, a column selection circuit, a row selection circuit, a read/write circuit (for example, configured to read data from and/or write data to memory cells 101 corresponding to a selected bit line pair (in other words, a selected column)), other suitable circuit, or combinations thereof. In some implementations, the controller 103 includes at least one sense amplifier configured to detect and/or amplify a voltage differential of a selected bit line pair. In some implementations, the sense amplifier is configured to latch or otherwise store data values of the voltage differential. A perimeter of memory array 100 is configured with dummy cells, such as edge dummy cells 105A, and 105B and well strap cells 107A, 107B, to ensure uniformity in performance of memory cells 101. However, in some embodiments, the perimeter of memory arrays 100 may include functional memory cells, such as SRAM cells 300, 400, and/or 500.

Figure 1C:
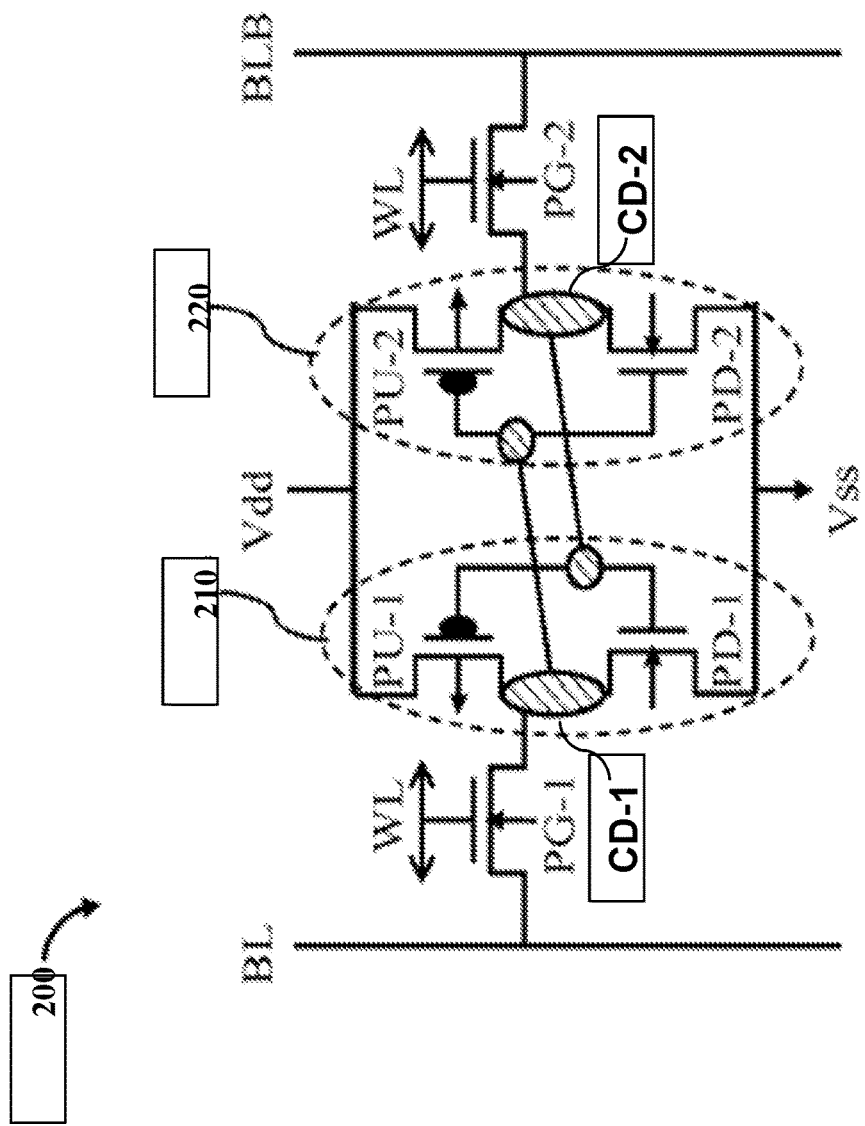
FIG. 1C is a circuit diagram of a single-port SRAM cell, which can be implemented in a memory cell of a SRAM array, according to various aspects of the present disclosure.

Each of SRAM cells 300, 400, and 500 may be a single-port SRAM cell or a multi-port SRAM cell. FIG. 1C is a plan view of an exemplary single-port SRAM cell 200, which can be implemented in a memory cell (such as SRAM cells 300, 400, and/or 500) of a SRAM array 100, according to various aspects of the present disclosure. FIG. 1C has been simplified for the sake of clarity to better understand the inventive concepts of the present disclosure. Additional features can be added in single-port SRAM cell 200, and some of the features described below can be replaced, modified, or eliminated in other embodiments of single-port SRAM cell 200. Single-port SRAM cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 200 is thus alternatively referred to as a 6T SRAM cell. In operation, pass-gate transistor PG-1 and pass-gate transistor PG-2 provide access to a storage portion of SRAM cell 200, which includes a cross-coupled pair of inverters, an inverter 210 and an inverter 220. Inverter 210 includes pull-up transistor PU-1 and pull-down transistor PD-1, and inverter 220 includes pull-up transistor PU-2 and pull-down transistor PD-2. In some implementations, pull-up transistors PU-1, PU-2 are configured as p-type transistors, and pull-down transistors PD-1, PD-2, as well as pass-gate transistors PG-1, PG-2, are configured as n-type transistors.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Though each of SRAM cells 300, 400, and 500 (if present) share similar structures, they are designed to have different performance characteristics dedicated for different applications. Such different performance characteristics may be achieved by different physical dimensions and/or different material compositions. One important performance characteristic is threshold voltage of transistors. Threshold voltage is the minimum gate-to-source voltage that is needed to create a conducting path between the source and drain terminals of the transistor. Advanced technologies generally benefit from a reduced threshold voltage, as it is an important scaling factor with respect to power efficiency. However, for low-power applications, a relatively high threshold voltage may be beneficial, as it reduces the leakage current and minimizes power consumption. Threshold voltage is largely determined by the difference in work function between the transistor channel semiconductor and the gate electrode. For a p-type transistor, a reduced threshold voltage may be achieved by utilizing a gate electrode material with a sufficiently high work function, such that the gate electrode work function approaches the valence band edge of the channel semiconductor. For an n-type transistor, a reduced threshold voltage may be achieved by utilizing a gate electrode material with a sufficiently low work function, such that the gate electrode work function approaches the conduction band edge of the channel semiconductor. In other words, threshold voltage of a transistor may be adjusted by proper selection of the gate electrode material based on their work functions. Additionally, threshold voltage is also affected by the additional charges at the transistor channel-dielectric interface, and by distributed charges through the dielectric. Accordingly, the threshold voltage may also be adjusted by tuning a material composition of the gate dielectric. Therefore, SRAM cells 300, 400, and 500 (if present) may each include transistors that have gate electrode materials with different work functions and/or gate dielectrics with different material compositions, so as to achieve the desired variations in performance characteristics. These similarities and differences are described with respect to FIGS. 2A-2E, 3A-3E, 4A-4E below.

Figure 2A:
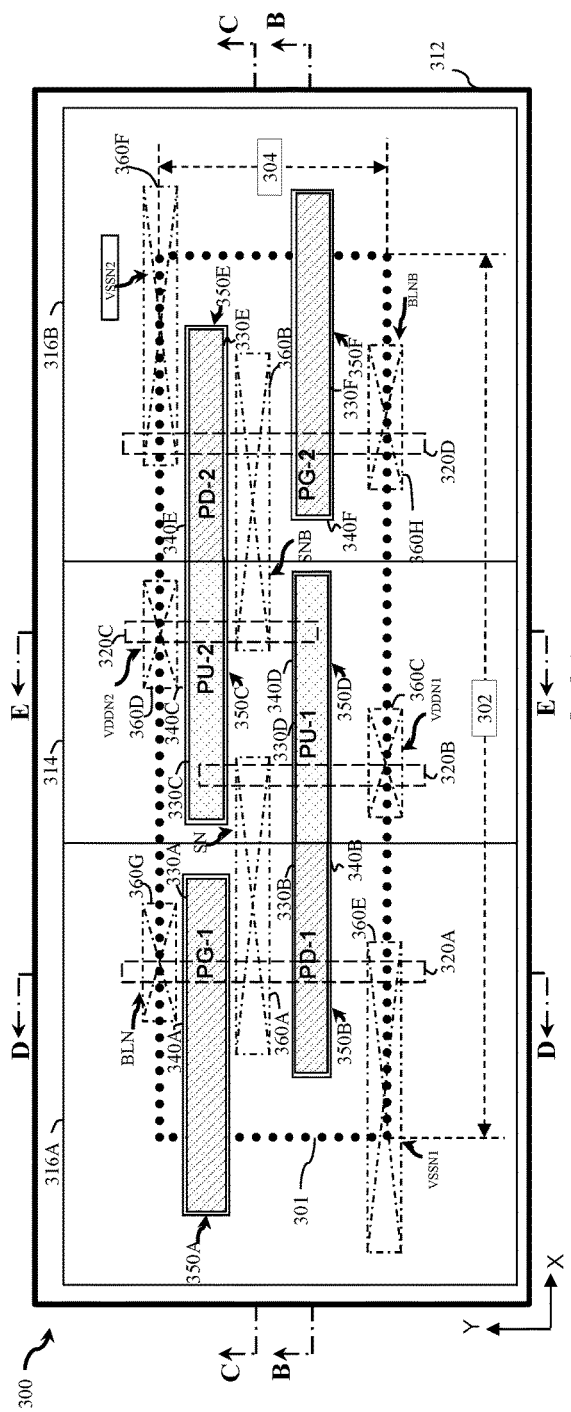
Figure 3A:
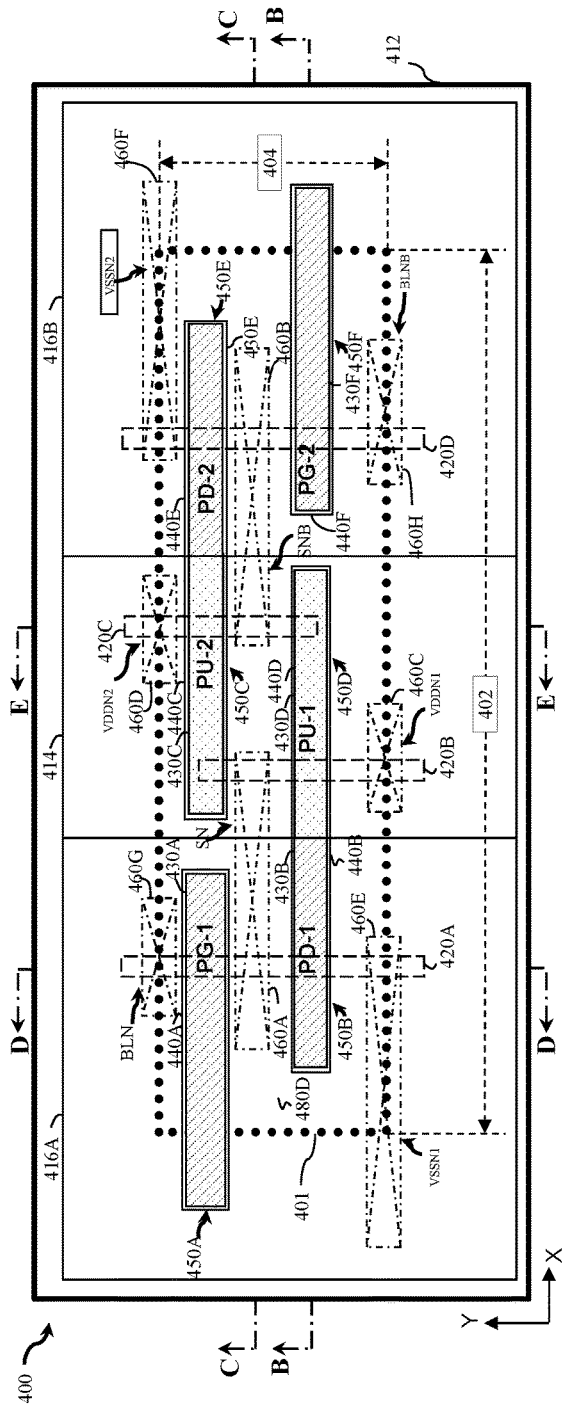
Figure 2B:
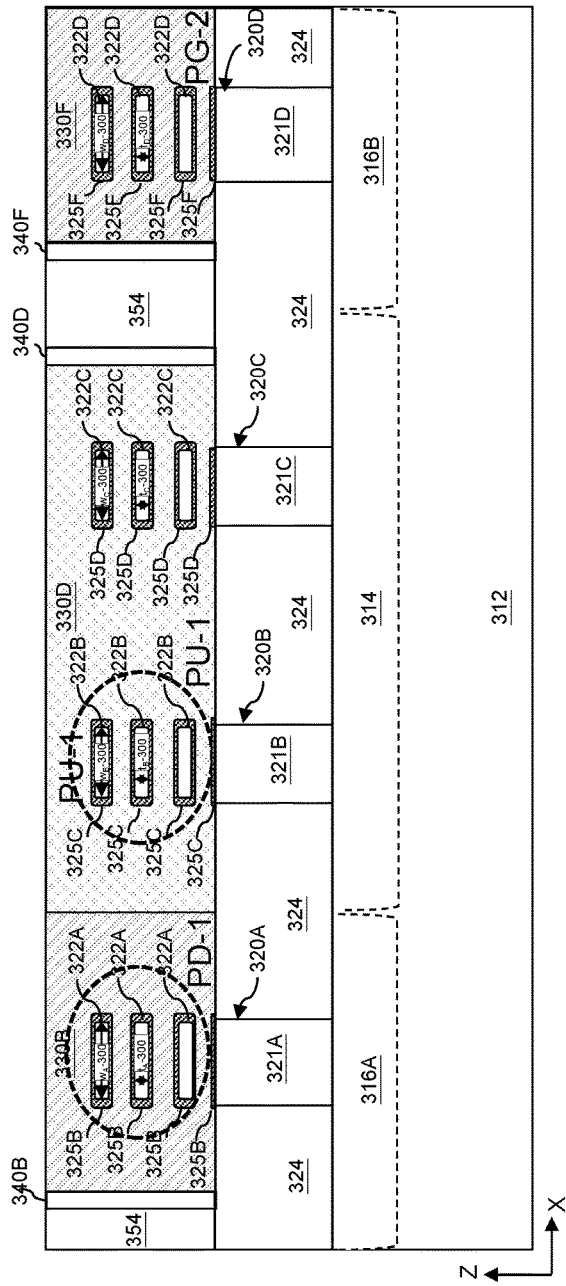
Figure 3B:
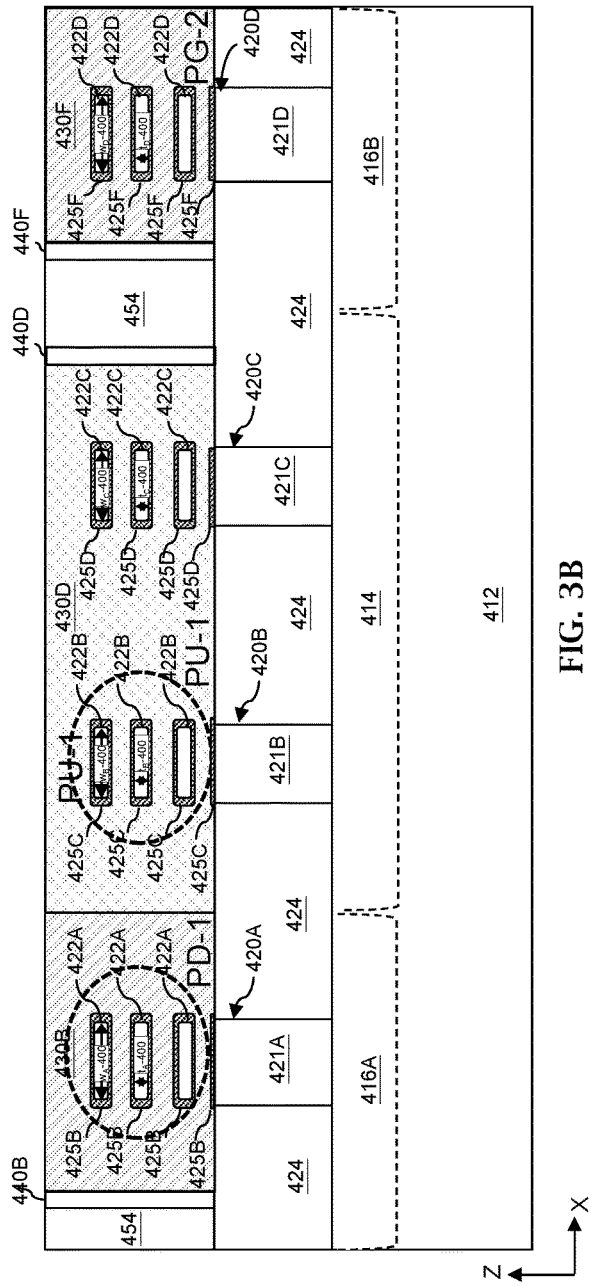
Figure 2C:
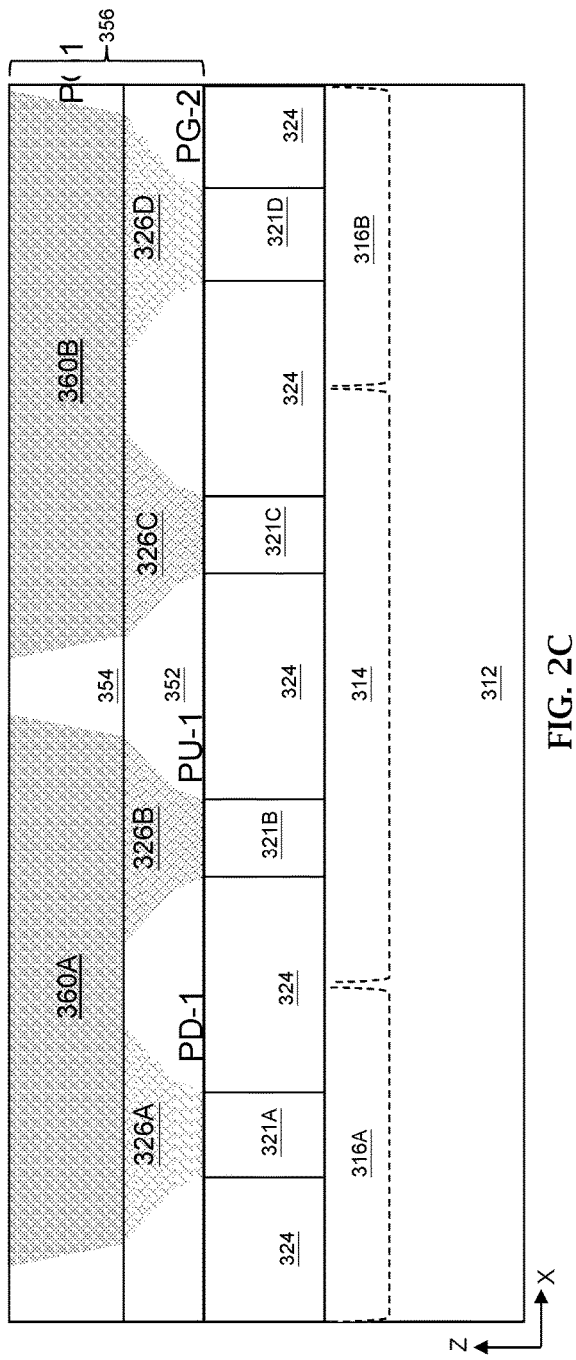
Figure 3C:
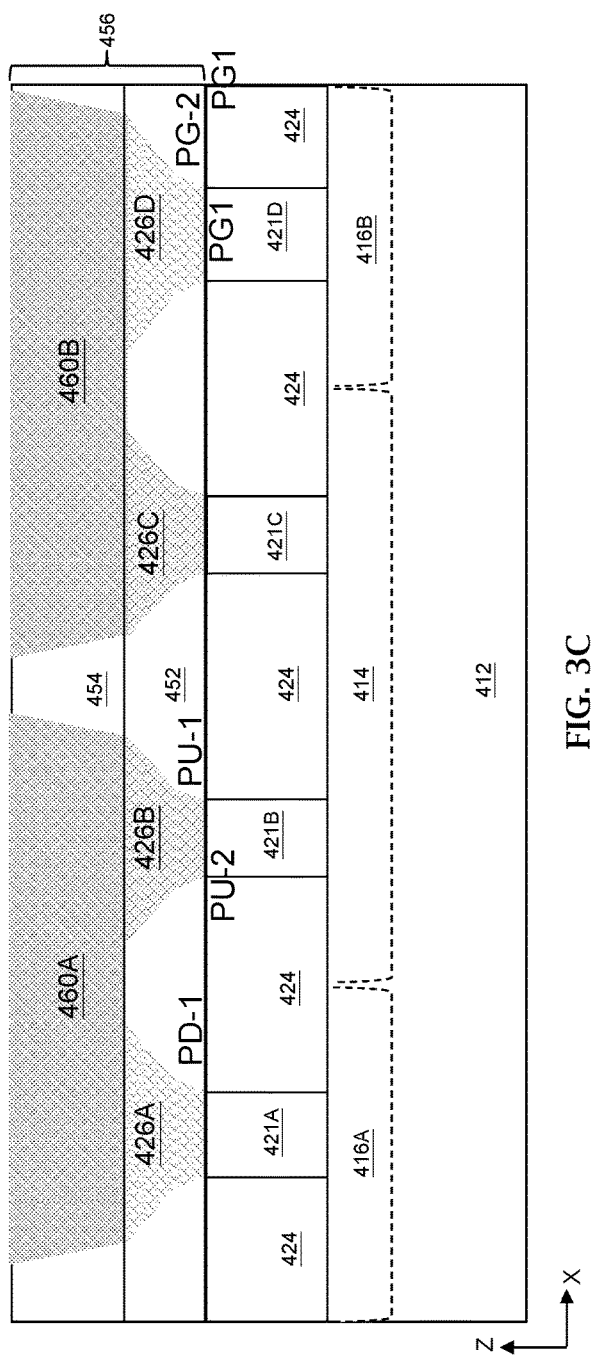
Figure 4A:
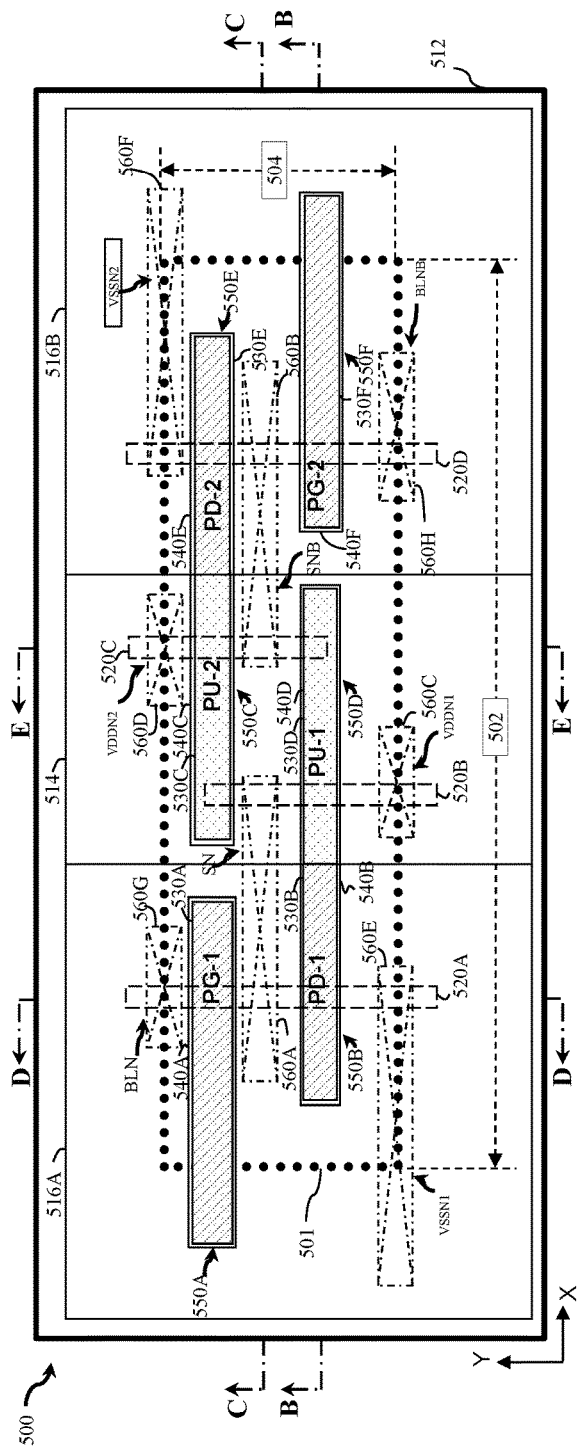
Figure 4B:
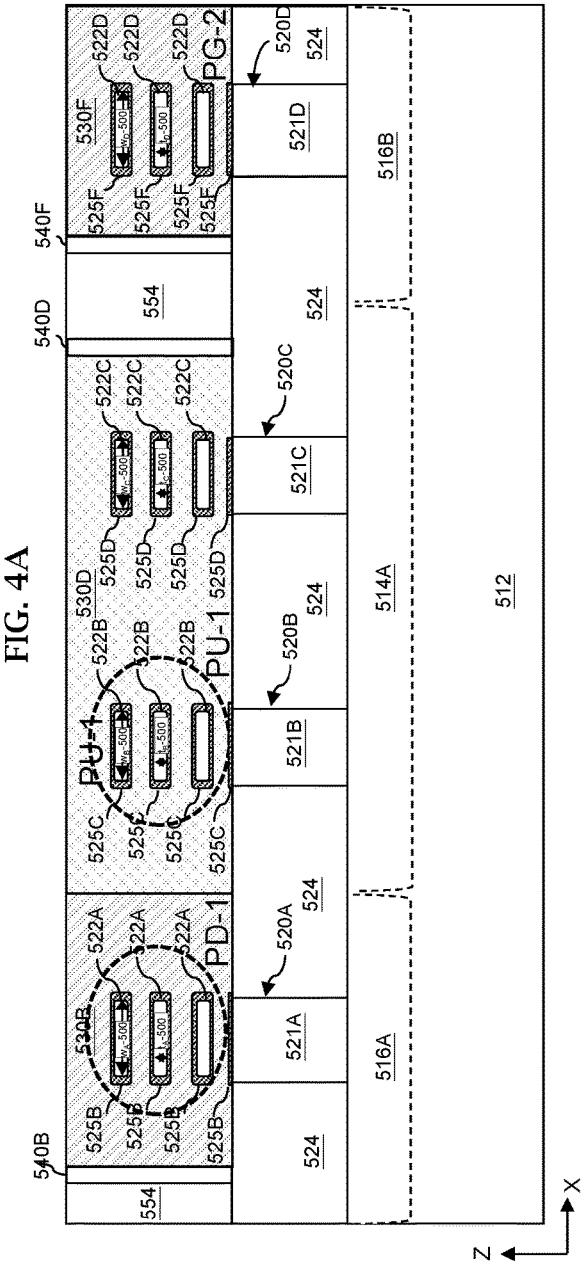

FIGS. 2A-2E, FIGS. 3A-3E, and FIGS. 4A-4E are fragmentary diagrammatic views of SRAM cell 300, SRAM cell 400, and SRAM cell 500, respectively, in portion or entirety, according to various aspects of the present disclosure. In particular, FIGS. 2A, 3A, and 4A are simplified schematic top views of SRAM cells 300, 400, and 500, respectively (for example, in an x-y plane); FIGS. 2B, 3B, and 4B are diagrammatic cross-sectional views of SRAM cells 300, 400, and 500 along lines B-B of FIGS. 2A, 3A, and 4A, respectively (for example, in an x-z plane); FIGS. 2C, 3C, and 4C are diagrammatic cross-sectional views of SRAM cells 300, 400, and 500 along lines C-C of FIGS. 2A, 3A, and 4A, respectively (for example, in an x-z plane); FIGS. 2D, 3D, and 4D are diagrammatic cross-sectional views of SRAM cells 300, 400, and 500 along lines D-D of FIGS. 2A, 3A, and 4A, respectively (for example, in an y-z plane); FIGS. 2E, 3E, and 4E are diagrammatic cross-sectional views of SRAM cells 300, 400, and 500 along lines E-E of FIGS. 2A, 3A, and 4A, respectively (for example, in an y-z plane). FIGS. 2A-2E, FIGS. 3A-3E, and FIGS. 4A-4E have been simplified for the sake of clarity to better understand the inventive concepts of the present disclosure. Additional features can be added in one or more of SRAM cells 300, 400, and 500, and some of the features described below can be replaced, modified, or eliminated in other embodiments of one or more of SRAM cells 300, 400, and 500. As described above, SRAM cells 300, 400, and 500 may include similar features, but may have different physical dimensions and/or different material compositions to achieve different designed functions.

SRAM cell 300 includes a substrate (wafer) 312. In the depicted embodiment, substrate 312 includes silicon. Alternatively or additionally, substrate 312 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 312 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 312 includes various doped regions configured according to design requirements of SRAM cell 300. In the depicted embodiment, substrate 312 includes an n-type doped region 314 (also referred to as an n-well) and two p-type doped regions 316A and 316B (also referred to as p-wells). N-type doped region 314 is configured for a p-type metal-oxide-semiconductor (PMOS) transistor, such as a pull-up (PU) transistor; and p-type doped regions 316A and 316B are each configured for an n-type MOS (NMOS) transistor, such as a pull-down (PD) transistor and a pass-gate (PG) transistor. N-type doped regions, such as n-type doped region 314, are doped with n-type dopants, such as phosphorus, arsenic, other n-type dopant, or combinations thereof. P-type doped regions, such as p-type doped region 316, are doped with p-type dopants, such as boron (for example, $BF_2$), indium, other p-type dopant, or combinations thereof. In some implementations, substrate 312 includes doped regions formed with a combination of p-type dopants and n-type dopants. The various doped regions can be formed directly on and/or in substrate 312, for example, providing a p-well structure, an n-well structure, a dual-well structure, a raised structure, or combinations thereof. An ion implantation process, a diffusion process, and/or other suitable doping process can be performed to form the various doped regions. In some implementations, n-type doped region 314 has an n-type dopant concentration of about $5\times10^{16}$ $cm^{-3}$ to about $5\times10^{19}$ $cm^{-3}$, and p-type doped regions 316A and 316B each has a p-type dopant concentration of about $5\times10^{16}$ $cm^{-3}$ to about $5\times10^{19}$ $cm^{-3}$.

As described above with respect to FIGS. 1C, SRAM cell 300 includes multiple transistors. Pull-up transistors PU-1, PU-2 are disposed over (and electrically connected to) n-well 314; pull-down transistor PD-1 and pass-gate transistor PG-1 are disposed over (and electrically connected to) p-well 316A; and pull-down transistor PD-2 and pass-gate transistor PG-2 are disposed over (and electrically connected to) p-well 316B. PU-1 and PU-2 are configured as p-type transistors, while PD-1, PD-2, PG-1, and PG-2 are configured as n-type transistors (as described in more details below). Each transistor includes a fin structure disposed over the substrate 312. For example, pass-gate transistor PG-1 includes a fin structure 320A; pull-down transistor PD-1 includes the fin structure 320A; pull-up transistor PU-1 includes a fin structure 320B; pull-up transistor PU-2 includes a fin structure 320C; pull-down transistor PD-2 includes a fin structure 320D; and pass-gate transistor PG-2 includes the fin structure 320D. Fin structures 320A and 320D include p-type doped fins; and fin structures 320B and 320C include n-type doped fins. In the depicted embodiments, the transistors are single fin transistors. However, in some embodiments, one or more of the transistors may be multi-fin transistors in order to achieve certain design needs, for example, to achieve increased drive current. Each transistor also includes a gate structure. For example, pass-gate transistor PG-1 includes gate structure 350A disposed over fin structure 320A (and between source/drain features); pull-down transistor PD-1 includes gate structure 350B disposed over fin structure 320A (and between source/drain features); pull-up transistor PU-2 includes gate structure 350C disposed over fin structure 320C (and between source/drain features); pull-transistor PU-1 includes gate structure 350D disposed over fin structure 320B (and between source/drain features); pull-down transistor PD-2 includes gate structure 350E disposed over fin structure 320D (and between source/drain features); and pass-gate transistor PG-2 includes gate structure 350F disposed over fin structure 320D (and between source/drain features). These fin structures and gate structures are described below.

Fin structures 320A-320D each include a base fin 321A-321D that extends from a top surface of substrate 312. In the depicted embodiment, base fins 321A-321D extend to a top surface of isolation feature 324. However, in some embodiments, base fins 321A-321D extend above a top surface of isolation feature 324. Base fins 321A-321D are oriented substantially parallel to one another along a y-direction, and each has a width defined in an x-direction and a height defined in a z-direction. The present disclosure contemplates variations in heights, widths, and/or lengths of base fins 321A-321D that may arise from processing and fabrication of SRAM cell 300. In the depicted embodiment, base fins 321A-321D have substantially the same widths along their respective heights. However, in some embodiments, base fins 321A-321D may have tapered widths along their respective heights. Base fins 321A-321D may each have an average width along their respective height from about 5 nm to about 15 nm. In some implementations, fin width varies depending on a position of a base fin relative to other base fins and/or relative to other features of SRAM cell 300. For example, widths of base fins in the center of an array may be greater than widths of base fins on the edge of the array.

In another example, alternatively, widths of base fins in the center of an array may be less than widths of base fins on the edge of the array.

Fin structures 320A-320D (and base fins 321A-321D) each have at least one channel region, at least one source region, and at least one drain region defined along their respective lengths in the y-direction, where a channel region is disposed between a source region and a drain region (generally and collectively referred to as source/drain regions). Each of the fin structures 320A-320D has at least one source feature and at least one drain feature (collectively, source/drain features 326A-326D) in the source/drain region. The source/drain features 326A-326D are described in more detail later. Fin structures 320A-320D each further include multiple channel layers 322A-322D formed in the channel region over the base fins 321A-321D. The channel layers 322A-322D each connect the respective pair of source/drain features 326A-326D, and each engages with a gate structure (as described in detail below), such that current can flow between the respective source/drain regions through the channel layers during operation. For example, a pair of source/drain features 326A are disposed over base fin 321A along its length in the y-direction. Channel layers 322A are also formed over base fin 321A interposing between the pair of source/drain features 326A, such that each channel layer connects the pair of source/drain features 326A. The channel layers 322A each engage with a gate structure 350A (as described below), such that current can flow between the source/drain regions through the channel layers 322A during the operation.

Each channel layer 322A has a lateral width (or "channel width") $w_A$-300 along the x-direction and a thickness $t_A$-300 (or "channel thickness") along the z-direction. In the depicted embodiment, each channel layer 322A has the same lateral width $w_A$-300 and/or the same thickness $t_A$-300 as one another. In some embodiments, channel layers 322A may have different lateral widths and/or different thicknesses from one another. In such embodiments, $w_A$-300 and $t_A$-300 represent the average lateral width and average thickness, respectively. Similarly, each of the channel layers 322B has a lateral width (or average lateral width) $w_B$-300 and a thickness (or average thickness) $t_B$-300; each of the channel layers 322C has a lateral width (or average lateral width) $w_C$-300 and a thickness (or average thickness) $t_C$-300; each of the channel layers 322D has a lateral width (or average lateral width) $w_D$-300 and a thickness (or average thickness) $t_D$-300. In the depicted embodiment, channel layers 322A-322D also have the same lateral width as the base fins 321A-321D that they overlay. In some embodiments, thicknesses of channel layers in regions of the same doping types are about equal to each other. For example, $t_A$-300 is about equal to $t_D$-300, and $t_B$-300 is about equal to $t_C$-300. In some embodiments, thicknesses $t_A$-300, $t_B$-300, $t_C$-300, and $t_D$-300 are each about equal to one another, and equal to a thickness t-300 (generally indicating a thickness of channel layers 322A, 322B, 322C, and 322D). Maintaining the same thickness between the channel layers simplifies fabrication processes. Additionally, in some embodiments, lateral widths of channel layers in regions of the same doping types are about equal to each other. For example, lateral width $w_A$-300 is about equal to $w_D$-300; and lateral width $w_B$-300 is about equal to $w_C$-300. In some embodiments, the lateral width $w_A$-300 (and $w_D$-300) is about equal to or greater than the thickness t-300. For example, a ratio of the lateral width $w_A$-300 (or $w_D$-300) to the thickness t-300 is about 1 to about 10. In some embodiments, the lateral widths of channel layers in p-type doped regions (for n-type transistors) may be greater than the lateral widths of channel layers in n-type doped regions (for p-type transistors). For example, a ratio of the lateral width $w_A$-300 (or $w_D$-300) to the lateral width $w_B$-300 (or $w_C$-300) is from about 1 to about 5. In SRAM operations, the read/write speed of the SRAM cell is largely dominated by the n-type transistors, while the p-type transistors serve to maintain the stability of the SRAM cell (such as to maintain the voltage to the data node). The greater lateral width for the n-type transistors allows a higher maximum available drain current ($I_{on}$) and improves cell performances in high-speed applications, without substantially affecting the functionalities of the p-type transistors. In some embodiments, one or more dimensions of the channel layers (such as lateral widths $w_A$-300, $w_B$-300, $w_C$-300, $w_D$-300, and/or thickness $t_A$-300, $t_B$-300, $t_C$-300, and $t_D$-300) are within a nanometer regime (such as between 1 nm to 1 μm). Accordingly, the channel layers may be considered a nanostructure, and may be interchangeably referred to as nanochannels. The channel layers may be of any shape, such as wires, sheets, bars, other appropriate shapes, or combinations thereof.

In some embodiments, the lateral widths $w_A$-300, $w_B$-300, $w_C$-300, and $w_D$-300 of channel layers of SRAM cell 300 are equal to corresponding lateral widths of channel layers of other SRAM cells, such as SRAM cell 400. Maintaining the same lateral widths for channel layers across different SRAM cells on the same memory chip simplifies the fabrication environment, thereby minimizing device variations and reducing development costs. However, in some embodiments, other SRAM cells (such as SRAM cell 500) may include channel layers that have lateral widths larger than $w_A$-300, $w_B$-300, $w_C$-300, and $w_D$-300 while having a thickness about equal to t-300. This is described in detail below. The larger lateral width improves the speed of the transistors and improves the performance of SRAM cells in superhigh-speed applications (such as CPUs).

Fin structures 320A-320D are formed over substrate 312 using any suitable process, for example, gate-all-around processing methods. In some implementations, a combination of deposition, lithography and/or etching processes are performed to define base fins 321A-321D and channel layers 322A-322D as illustrated in FIGS. 2A-2E. Base fins 321A-321D may be formed from a portion of substrate 312, therefore having the same material as substrate 312. For example, base fins 321A-321D and substrate 312 may both include silicon (Si). Channel layers 322A-322D include a semiconductor material, such as Si, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In the depicted embodiment, channel layers include silicon. Channel layers 322A-322D may be formed from a material layer overlying substrate 312. In some implementations, the material layer includes alternating Si semiconductor layers and SiGe layers. During the processing, one of the alternating semiconductor layers (such as SiGe layers) are removed without substantially removing the other alternating semiconductor layers (such as Si layers), thereby creating a suspended structure. The remaining alternating semiconductor layers (such as Si layers) become the channel layers 322A-322D. As described above, the channel layers 322A-322D are formed in the channel region interposing a source region and a drain region. Accordingly, channel layers 322A-322D each interpose and connect a respective pair of source/drain features 326A-326D.

Isolation feature(s) 324 is formed over and/or in substrate 312 to isolate various regions, such as various device regions of SRAM cell 300. For example, isolation feature 324 separates and isolates fins from one another, such as base fins 321A-321D. In the depicted embodiment, isolation feature 324 surrounds base fins 321A-321D. In some embodiments, isolation feature 324 surrounds a bottom portion of base fins 321A-321D, such that at least a portion of base fins 321A-321D protrudes above the top surface of the isolation feature 324. Isolation feature 324 includes silicon oxide, silicon nitride, silicon oxynitride, other suitable isolation material (for example, including silicon, oxygen, nitrogen, carbon, or other suitable isolation constituent), or combinations thereof. Isolation feature 324 can include different structures, such as shallow trench isolation (STI) structures, deep trench isolation (DTI) structures, and/or local oxidation of silicon (LOCOS) structures. In some implementations, STI features can be formed by etching a trench in substrate 312 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 324. In some implementations, STI features can be formed by depositing an insulator material over substrate 312 after forming base fins 321A-321D, such that the insulator material layer fills gaps (trenches) between base fins 321A-321D, and etching back the insulator material layer to form isolation feature 324. In some implementations, isolation feature 324 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 324 includes a dielectric layer disposed over a doped liner layer (including, for example, boron silicate glass (BSG) or phosphosilicate glass (PSG)).

As noted, gate structures 350A-350F are disposed over fin structures 320A-320D. Gate structures 350A-350F each extend along the x-direction (for example, substantially orthogonal to the lengthwise direction of fin structures 320A-320D). In the depicted embodiment, gate structure 350A is disposed over a channel region of fin structure 320A and interposes a pair of source/drain features 326A; and gate structure 350B is disposed over another channel region of fin structure 320A and interposes another pair of source/drain features 326A. Gate structures 350A and 350B each engage and wrap a respective stack of channel layers 322A, such that current can flow between respective source/drain regions during operation. In some embodiments, gate structures 350A and 350B are positioned such that at least one source/drain feature 326A (for example, a common drain feature or two coupled drain features) is disposed between gate structure 350A and gate structure 350B. In some implementations, gate structure 350A and a portion of fin structure 320A form the pass-gate transistor PG-1; and gate structure 350B and a portion of fin structure 320A form the pull-down transistor PD-1. Similarly, gate structures 350E and 350F are each disposed over a channel region of fin structure 320D and interpose a respective pair of source/drain features 326D. Gate structures 350E and 350F each engage and wrap a respective stack of channel layers 322D, such that current can flow between respective source/drain regions during operation. In some embodiments, gate structures 350E and 350F are positioned such that at least one source/drain feature 326D (for example, a common drain feature or two coupled drain features) is disposed between gate structure 350E and gate structure 350F. In some implementations, gate structure 350E and a portion of fin structure 320D form the pull-down transistor PD-2, and gate structure 350F and a portion of fin structure 320D form the pass-gate transistor PG-2. Additionally, gate structure 350C is disposed over a channel region of fin structure 320C, interposing a pair of source/drain features 326C. Gate structure 350C engages and wraps a stack of channel layers 322C, such that current can flow between respective source/drain regions during operation. In some implementations, gate structure 350C and a portion of fin structure 320C form the pull-up transistor PU-2. Furthermore, gate structure 350D is disposed over a channel region of fin structure 320B, interposing a pair of source/drain features 326B. Gate structure 350D engages and wraps a stack of channel layers 322B, such that current can flow between respective source/drain regions during operation. In some implementations, gate structure 350D and a portion of fin structure 320B form the pull-up transistor PU-1.

Gate structures 350A-350F each include respective gate stacks configured to achieve desired functionality according to design requirements of SRAM cell 300, such that gate structures 350A-350F include the same or different layers and/or materials from one another. In the depicted embodiment, gate structures 350A-350F have gate stacks that include gate dielectrics 325A-325F, gate electrodes 330A-330F, and hard mask layers 370A-370F. Gate structures 350A-350F may have different gate stacks formed in different doped regions, such as in n-type doped region 314 compared to in p-type doped regions 316A and 316B.

The gate stacks of gate structures 350A-350F are fabricated according to a gate last process, a gate first process, or a hybrid gate last/gate first process. In gate last process implementations, one or more of gate structures 350A-350F include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 325A-325F and/or gate electrode 330A-330F are subsequently formed. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectrics 325A-325F, gate electrodes 330A-330F, and/or hard mask layers 370A-370F, planarizing gate structures 350A-350F.

Gate dielectrics 325A-325F are conformally disposed over and around respective channel layers 322A-322D and over isolation feature 324, such that gate dielectrics 325A-325F have a substantially uniform thickness. In the depicted embodiment, gate dielectrics 325A-325F are disposed directly on each of the respective channel layers 322A-322D. Gate dielectrics 325A-325F include a dielectric material, such as silicon oxide, high-k dielectric material, other suitable dielectric material, or combinations thereof. In the depicted embodiment, gate dielectrics 325A-325F include a high-k dielectric layer including, for example, hafnium, aluminum, zirconium, lanthanum, tantalum, titanium, yttrium, oxygen, nitrogen, other suitable constituent, or combinations thereof. In some implementations, the high-k dielectric layer includes $HfO_2$, HfSiO, HfSiON, HfTaO, HfTi, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectrics 325A-325F each further include an interfacial layer (including a dielectric material, such as silicon oxide) disposed between the high-k dielectric layer and the respective channel layers 322A-322D, and isolation feature 324.

In some embodiments, one or more of the gate dielectrics 325A, 325B, 325E, and 325F include a lanthanum dopant. Lanthanum generally refers to the metallic chemical element with atomic numbers 57, and is one of the lanthanide (or, rare earth) elements. It has been found that for an n-type transistor (such as PD-1, PD-2, PG-1, and PG-2 disclosed herein), incorporating a lanthanum dopant into a gate dielectric may lower the threshold voltage of the n-type transistor as compared to the n-type transistor without the lanthanum dopant in the gate dielectric. Additionally, the amount of the lanthanum dopant is correlated to the amount of shift in the threshold voltage of the transistor. In other words, by adjusting the presence/absence of the lanthanum dopant and/or the concentration of the lanthanum dopant in a gate dielectric layer, the threshold voltage of pull-down and pass-gate transistors may be effectively tuned. Therefore, incorporating a lanthanum dopant into the gate dielectrics of n-type transistors of a first SRAM cell, but not n-type transistors of the same type of a second SRAM cell on the same memory chip, can allow for SRAM cells having n-type transistors of the same type with different threshold voltages—thus achieving two sets of n-type transistors of the same type on the same memory chip, each optimized for different applications depending on design requirements for the SRAM cells. For example, incorporating a lanthanum dopant into the gate dielectrics 325A, 325B, 325E, and 325F can lower a threshold voltage of one or more n-type transistors PG-1, PD-1, PD-2, and/or PG-2 of SRAM cell 300 relative to a threshold voltage of the same type of n-type transistors of another SRAM cell (such as PG-1, PD-1, PD-2, and PG-2 of SRAM cell 400), which have gate dielectrics that do not have the lanthanum dopant. Alternatively, incorporating a greater amount of a lanthanum dopant into the gate dielectrics 325A, 325B, 325E, and 325F can lower the threshold voltage of one or more n-type transistors PG-1, PD-1, PD-2, and/or PG-2 of SRAM cell 300 relative to the threshold voltage of the same type of n-type transistors of another SRAM cell (such as PG-1, PD-1, PD-2, and PG-2 of SRAM cell 400), which have gate dielectrics that include a less amount of the lanthanum dopant. In some embodiments, the gate dielectrics 325A, 325B, 325E, and/or 325F of SRAM cell 300 includes lanthanum at an atomic percentage (relative to the total number of atoms in the gate dielectric) of about 0.5% to about 5%. In some embodiments, n-type transistors PG-1, PD-1, PD-2, and/or PG-2 of SRAM cell 300 may have a threshold voltage of about 0.2 V to about 0.4 V. In some implementations, the threshold voltage difference of n-type transistors of SRAM cell 300 relative to n-type transistors of the same type of other SRAM cells on the same memory chip may be 30 mV to 120 mV.

In some embodiments, one or both of gate dielectrics 325C and 325D are free of a lanthanum dopant. It has been found that for a p-type transistor (such as PU-1 and PU-2 disclosed herein), incorporating a lanthanum dopant into a gate dielectric has an opposite effect to that for an n-type transistor. Therefore, a p-type transistor free from a lanthanum dopant in its gate dielectric may have a threshold voltage lower than the p-type transistor with the lanthanum dopant. Additionally, the amount of the lanthanum element is correlated to the amount of shift in the threshold voltage of the transistor. In other words, by adjusting the presence/absence of the lanthanum dopant and/or the concentration of the lanthanum dopant in a gate dielectric layer, the threshold voltage of pull-up transistors may also be effectively tuned. Therefore, incorporating a lanthanum dopant into the gate dielectrics of p-type transistors of a first SRAM cell (e.g., PU-2 and PU-1 of SRAM cell 300), but not p-type transistors of the same type of a second SRAM cell on the same memory chip (e.g., PU-2 and PU-1 of SRAM cell 400), can allow for SRAM cells having p-type transistors of the same type with different threshold voltages—thus achieving two sets of p-type transistors of the same type on the same memory chip, each optimized for different applications depending on design requirements for the SRAM cells. For example, incorporating lanthanum dopant into the gate dielectrics 325C, 325D can increase a threshold voltage of p-type transistors PU-1 and/or PU-2 relative to a threshold voltage of the same type of p-type transistors of another SRAM cell (such as PU-2 and PU-1 of SRAM cell 400), which have gate dielectrics that do not have the lanthanum dopant. Alternatively, p-type transistors PU-2 and PU-1 of SRAM cell 300 may also have a threshold voltage lower than the same type of transistor of a different SRAM cell (such as PU-2 and PU-1 of SRAM cell 400) if the gate dielectrics 325C and 325D includes less amount of lanthanum dopant than the same type of transistor of the different SRAM cell. In some embodiments, the gate dielectrics 325C and/or 325D includes lanthanum at an atomic percentage (relative to the total number of atoms in the gate dielectric) of about 0.5% to about 5%. In some embodiments, p-type transistors PU-1 and/or PU-2 may have a threshold voltage of about 0.2 V to about 0.4 V. In some implementations, the threshold voltage difference of p-type transistors of SRAM cell 300 relative to p-type transistors of the same type of other SRAM cells on the same memory chip may be 30 mV to 120 mV.

Gate electrodes 330A-330F are disposed over gate dielectrics 325A-325F. Gate electrodes 330A-330F each include an electrically conductive material. In some implementations, gate electrodes 330A-330F each include multiple layers, such as one or more capping layers, work function layers, glue/barrier layers, and/or metal fill (or bulk) layers. A capping layer can include a material that prevents or eliminates diffusion and/or reaction of constituents between gate dielectrics 325A-325F and other layers of gate structures 350A-350F (in particular, gate layers including metal).

In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layers 370A-370F are disposed over gate electrode 330A-330F and includes any suitable material, such as silicon, nitrogen, and/or carbon (for example, silicon nitride or silicon carbide).

In some embodiments, one or more of gate electrodes 330A, 330B, 330E, and 330F include an n-type work function metal with a work function of about 4.0 eV to about 4.6 eV. In some embodiments, one or both gate electrodes 330C and 330D include a p-type work function metal with a work function of about 4.5 eV to about 5 eV.

In some implementations, one or more gate electrodes 330D-330F include a combination of p-type work function layer (such as a TiN layer), n-type work function layer (such as a TiAl layer), capping layer (such as a TaN layer), and metal fill layer (such as a W layer). The work function of the gate electrodes and the threshold voltage of the gate stacks may be tuned by adjusting the thicknesses of one or more of the layers. For example, a gate electrode may include a W metal fill layer over a TiN layer, and the TiN layer over a TiAl layer. The work function of the gate electrode and the threshold voltage of the gate stack may be tuned by adjusting the thickness of the TiN layer. A thicker TiN layer blocks the diffusion of aluminum from the TiAl layer into the W metal fill layer. As aluminum diffusion causes a reduction of work function of the gate electrode, the reduction in aluminum diffusion effectuates a higher work function of the gate electrode. Additionally, because the total thickness of the gate electrode is limited by the channel-to-channel spacing between the channel layers 322A-322D, a thicker TiN layer typically mandates a thinner TiAl. A thinner TiAl also leads to reduced amount of aluminum available for diffusion, contributing to a higher work function. Conversely, a thinner TiN layer over the TiAl layer leads to more aluminum diffusion, either due to the thinner TiN layer as a barrier or due to the increased amount of aluminum available for diffusion. Such gate electrodes may have lower work functions. For an n-type transistor (such as PG-1, PD-1, PD-2, and PG-2), a lower work function results in a smaller gap between the work function of the gate electrode and the conduction band edge of the semiconductor substrate, resulting in a smaller threshold voltage. Accordingly, transistors PG-1, PD-1, PD-2, and/or PG-2 can be configured with thinner TiN layers to have smaller threshold voltages. Conversely, for a p-type transistor (such as PU-1 and PU-2), a higher work function results in a smaller gap between the work function of the gate electrode and the valence band edge of the semiconductor substrate, resulting in a smaller threshold voltage. Accordingly, transistors PU-1 and/or PU-2 can be configured with thicker TiN layers to have smaller threshold voltages. In some embodiments, gate electrodes 330A, 330B, 330C, 330D, 330E, and/or 330F include a TiN layer with a thickness of about 4 nm to about 40 nm.

In some embodiments, one or more gate electrodes of n-type transistors of SRAM cell 300 (such as gate electrodes 330A, 330B, 330E, and 330F) include a thinner TiN layer (therefore a lower threshold voltage) than gate electrodes of the same types of n-type transistors in a different SRAM cell (for example, SRAM cell 400). In some implementations, the threshold voltage difference of n-type transistors of SRAM cell 300 relative to n-type transistors of the same type of other SRAM cells on the same memory chip may be 30 mV to 120 mV. In some embodiments, one or both of gate electrodes of p-type transistors of SRAM cell 300 (such as gate electrodes 330C and 330D) include a thicker TiN layer (therefore a lower threshold voltage) than gate electrodes of the same type of p-type transistors in a different SRAM cell (for example, SRAM cell 400). In some implementations, the threshold voltage difference of p-type transistors of SRAM cell 300 relative to p-type transistors of the same type of other SRAM cells on the same memory chip may be 30 mV 120 mV.

Gate structures 350A-350F further include respective gate spacers 340A-340F disposed adjacent to (for example, along sidewalls of) the respective gate stacks. Gate spacers 340A-340F are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 312 and subsequently anisotropically etched to form gate spacers 340A-340F. In some implementations, gate spacers 340A-340F include a multi-layer structure, such as a first dielectric layer that includes silicon nitride and a second dielectric layer that includes silicon oxide. In some implementations, gate spacers 340A-340F include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 312 and subsequently anisotropically etched to form a first spacer set adjacent to the gate stacks, and a second dielectric layer including silicon and nitrogen can be deposited over substrate 312 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features before and/or after forming gate spacers 340A-340F.

Epitaxial source features and epitaxial drain features 326A-326D (referred to as epitaxial source/drain features 326A-326D) are disposed over the source/drain regions of fin structures 320A-320D. For example, semiconductor material is epitaxially grown on base fins 321A-321D, forming epitaxial source/drain features 326A-326D. In the depicted embodiment, a fin recess process (for example, an etch back process) is performed on source/drain regions of fin structures 320A-320D, such that base fin 321A-321D has a top surface that extends along a top surface of the isolation feature 324. In such implementations, epitaxial source/drain features 326A-326D are grown from the top surface of base fins 320A-320D. In some implementations, source/drain regions of fin structures 320A-320D are not subjected to a fin recess process, such that base fins 321A-321D have a top surface that extends above a top surface of the isolation feature 324. In such implementations, epitaxial source/drain features 326A-326D are grown from and wrap at least a top portion of base fins 320A-320D. In furtherance of the depicted embodiment, epitaxial source/drain features 326A-326D each extend (grow) laterally along the x-direction (in some implementations, substantially perpendicular to the lengthwise direction of fin structures 320A-320D), such that epitaxial source/drain features 326A-326D have a greater lateral width along the x-direction than base fins 321A-321D. In some embodiments, epitaxial source/drain features are merged, such that they span more than one fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of base fins 321A-321D. Epitaxial source/drain features 326A-326D are doped with n-type dopants and/or p-type dopants. For example, epitaxial source/drain features 326A and 326D (for n-type transistors PG-1, PD-1, PD-2, and PG-2) each include an n-type dopant and are formed from epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). In furtherance of the example, the epitaxial source/drain features 326B and 326C (for p-type transistors PU-1 and PU-2) each include a p-type dopant and are formed from epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In some implementations, epitaxial source/drain features 326A-326D include materials and/or dopants that achieve desired tensile stress and/or compressive stress in the channel region. In some implementations, epitaxial source/drain features 326A-326D are doped during deposition by adding impurities to a source material of the epitaxy process. In some implementations, epitaxial source/drain features 326A-3260D are doped by an ion implantation process subsequent to a deposition process. In some implementations, annealing processes are performed to activate dopants in epitaxial source/drain features 326A-326D and/or other source/drain regions, such as HDD regions and/or LDD regions. In some implementations, silicide layers are formed on epitaxial source/drain features 326A-326D. In some implementations, silicide layers are formed by depositing a metal layer over epitaxial source/drain features 326A-326D. The metal layer includes any material suitable for promoting silicide formation, such as nickel, platinum, palladium, vanadium, titanium, cobalt, tantalum, ytterbium, zirconium, other suitable metal, or combinations thereof. SRAM cell 300 is then heated (for example, subjected to an annealing process) to cause constituents of epitaxial source/drain features 326A-326D (for example, silicon and/or germanium) to react with the metal. The silicide layers thus include metal and a constituent of epitaxial source/drain features 326A-326D (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 326A-326D are collectively referred to as the epitaxial source/drain features of transistors of SRAM cell 300.

A multilayer interconnect (MLI) feature 356 is disposed over substrate 312. MLI feature 356 electrically couples various devices (for example, p-type transistors PU-1 and PU-2, n-type transistors PG-1, PD-1, PD-2, and PG-2, other transistors, resistors, capacitors, and/or inductors) and/or components (for example, gate structures (for example, gate structures 350A-350F) and/or source/drain features (for example, epitaxial source/drain features 326A-326D)) of SRAM cell 300, such that the various devices and/or components can operate as specified by design requirements of SRAM cell 300. MLI feature 356 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 356. During operation of SRAM cell 300, the interconnect features are configured to route signals between the devices and/or the components of SRAM cell 300 and/or distribute signals (for example, clock signals, voltage signals, and/or ground signals) to the devices and/or the components of SRAM cell 300. It is noted that though MLI feature 356 is depicted with a given number of dielectric layers and conductive layers, the present disclosure contemplates MLI feature 356 having more or fewer dielectric layers and/or conductive layers.

MLI feature 356 includes one or more dielectric layers, such as an interlayer dielectric layer 352 (ILD-0) disposed over substrate 312, an interlayer dielectric layer 354 (ILD-1) disposed over ILD layer 352, as well as additional ILD layers disposed over ILD layer 354 (not shown). ILD layers 352, 354 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK® (Dow Chemical, Midland, Michigan), polyimide, other low-k dielectric material, or combinations thereof. In the depicted embodiment, ILD layers 352, 354 are dielectric layers that include a low-k dielectric material (generally referred to as low-k dielectric layers). In some implementations, low-k dielectric material generally refers to materials having a dielectric constant (k) that is less than 3. ILD layers 352, 354 can include a multilayer structure having multiple dielectric materials. MLI feature 356 can further include one or more contact etch stop layers (CESLs) disposed between ILD layers 352, 354, such as a CESL disposed between ILD layer 352 and ILD layer 354, a CESL disposed between ILD layer 354 and additional ILD layers (not shown). In some implementations, a CESL is disposed between substrate 312 and/or isolation feature 324 and ILD layer 352. CESLs include a material different than ILD layers 352, 354, such as a dielectric material that is different than the dielectric material of ILD layers 352, 354. For example, where ILD layers 352, 354 include a low-k dielectric material, CESLs include silicon and nitrogen, such as silicon nitride or silicon oxynitride. ILD layers 352, 354 are formed over substrate 312 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 352, 354 are formed by a flowable CVD (FCVD) process that includes, for example, depositing a flowable material (such as a liquid compound) over substrate 312 and converting the flowable material to a solid material by a suitable technique, such as thermal annealing and/or ultraviolet radiation treating. Subsequent to the deposition of ILD layers 352, 354, a CMP process and/or other planarization process is performed, such that ILD layers 352, 354 have substantially planar surfaces.

Device-level contacts 360A-360H are disposed in ILD layers 354 to form a part of MLI feature 356. Device-level contacts 360A-360H include any suitable electrically conductive material, such as Ta, Ti, Al, Cu, Co, W, TiN, TaN, other suitable conductive materials, or combinations thereof. Various conductive materials can be combined to provide device-level contacts 360A-360H with various layers, such as a barrier layer, an adhesion layer, a liner layer, a bulk layer, other suitable layer, or combinations thereof. In some implementations, device-level-contacts 360A-360H include Ti, TiN, and/or Co, and are formed by patterning ILD layer 354. Patterning ILD layer 354 can include lithography processes and/or etching processes to form openings (trenches), such as contact openings, in ILD layer 354. In some implementations, the lithography processes include forming a resist layer over ILD layer 354, exposing the resist layer to patterned radiation, and developing the exposed resist layer, thereby forming a patterned resist layer that can be used as a masking element for etching opening(s) in ILD layer 354. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 354 and a top surface of device-level contacts 360A-360H.

Device-level contacts 360A-360H (also referred to as local interconnects or local contacts) electrically couple and/or physically couple IC device features, such as features of p-type transistors PU-1 and PU-2, and n-type transistors PG-1, PD-1, PD-2, and PG-2, to other components of MLI feature 356, for example, vias of the MLI feature (not shown). For example, device-level contacts 360A-360H are metal-t$_d$-device (MD) contacts, which generally refer to contacts to a conductive region, such as source/drain regions, of SRAM cell 300. Device-level contacts 360A-360H extend through ILD layer 354, though the present disclosure contemplates embodiments where device-level contacts 360A-360H extend through more ILD layers and/or CESLs of MLI feature 356. In some implementations, one or more of device-level contacts 360A-360H do not connect their source/drain regions to another electrically conductive feature of MLI feature 356, such as vias. In some implementations, MLI feature 356 further includes conductive lines that extend in a direction substantially orthogonal to conductive lines to form a different metal layer. The present disclosure contemplates different configurations of device-level contacts 360A-360H, vias, and/or conductive lines, depending on design requirements of SRAM cell 300.

A drain region of pull-down transistor PD-1 (formed by n-type epitaxial source/drain features 326A) and a drain region of pull-up transistor PU-1 (formed by p-type epitaxial source/drain features 326B) are electrically connected by device-level contact 360A, such that a common drain of pull-down transistor PD-1 and pull-up transistor PU-1 form a storage node SN, which is further electrically connected to a drain region of pass-gate transistor PG-1 (formed by n-type epitaxial source/drain features 326A) by device-level contact 360A. A drain region of pull-down transistor PD-2 (formed by n-type epitaxial source/drain features 326D) and a drain region of pull-up transistor PU-2 (formed by p-type epitaxial source/drain features 326C) are electrically connected by device-level contact 360B, such that a common drain of pull-down transistor PD-2 and pull-up transistor PU-2 form a storage node SNB, which is further electrically connected to a drain region of pass-gate transistor PG-2 (formed by n-type epitaxial source/drain features 326D) by device-level contact 360B. A source region of pull-up transistor PU-1 (formed by p-type epitaxial source/drain features 326B) is electrically connected to a power supply voltage $V_{DD}$ at a voltage node VDDN1 by device-level contact 360C; and a source region of pull-up transistor PU-2 (formed by p-type epitaxial source/drain features 326C) is electrically connected to power supply voltage $V_{DD}$ at a voltage node VDDN2 by device-level contact 360D. A source region of pull-down transistor PD-1 (formed by n-type epitaxial source/drain features 326A) is electrically connected to a power supply voltage $V_{SS}$ at a voltage node VSSN1 by device-level contact 360E; and a source region of pull-down transistor PD-2 (formed by n-type epitaxial source/drain features 326D) is electrically connected to power supply voltage $V_{SS}$ at a voltage node VSSN2 by device-level contact 360F. A source region of pass-gate transistor PG-1 (formed by n-type epitaxial source/drain features 326A) is electrically connected to a bit line (generally referred to as a bit line node BLN) by device-level contact 360G; and a source region of pass-gate transistor PG-2 (formed by n-type epitaxial source/drain features 326D) is electrically connected to a complementary bit line (generally referred to as a bit line node BLNB) by device-level contact 360H.

Sometimes, such as when a SRAM cell does not operate at a sufficiently high speed, a write-assist circuit is needed to improve the write margin. In the depicted embodiment, SRAM cell 300 operates at a sufficiently high speed. Accordingly, SRAM cell 300 is not connected to a write-assist circuit. This may be in contrast to other SRAM cells on the same memory chip (such as SRAM cell 400). This is described in more detail below.

SRAM cell 300 has a cell boundary 301. In some embodiments, the SRAM cell 300 is of a rectangular shape. For example, SRAM cell 300 has a length 302 along the x-direction, and a width 304 along the y-direction. In furtherance of the example, the length 302 is equal to the word-line length in the unit cell region; and the width 304 is equal to the bit-line length in the unit cell region. In some embodiments, the length 302 is larger than the width 304. For example, a ratio of the length 302 to the width 304 may be about 2 to about 4.

FIGS. 3A-3E illustrate detailed structures for SRAM cell 400. SRAM cell 400 includes similar features as SRAM cell 300, though the features may have physical dimensions, material compositions, and/or performance characteristics, different than those of SRAM cell 300. These similarities and differences are described in detail below.

SRAM cell 400 includes a substrate 412 having various doped regions disposed therein, such as an n-type doped region 414 and p-type doped regions 416A and 416B. Substrate 412, n-type doped region 414, and p-type doped regions 416A and 416B are respectively similar to substrate 312, n-type doped region 314, and p-type doped regions 316A and 316B described above with reference to FIGS. 2A-2E. SRAM cell 400 further includes various features disposed over n-type doped region 414 and p-type doped regions 416A and 416B, where the various features are configured to achieve desired functionalities. For example, SRAM cell 400 includes fin structures 420A-420D, each having base fins 421A-421D (similar to fin structures 320A-320D having base fins 321A-321D described above with reference to FIGS. 2A-2E) and channel layers 422A-422D (similar to fin structures 320A-320D having channel layers 322A-322D described above with reference to FIGS. 2A-2E). Channel layers 422A, 422B, 422C, and 422D each has a respective lateral width $w_A$-400, $w_B$-400, $w_C$-400, and $w_D$-400 (similar to lateral widths $w_A$-300, $w_B$-300, $w_C$-300, and $w_D$-300 described above with reference to FIGS. 2A-2E) and a thickness t-400 (similar to the thickness t-300 described above with reference to FIGS. 2A-2E). SRAM cell 400 further includes isolation feature 424 (similar to isolation feature 324 described above with reference to FIGS. 2A-2E), gate structures 450A-450F (similar to gate structures 350A-350F described above with reference to FIGS. 2A-2E) (including, for example, gate dielectrics 425A-425F, gate electrodes 430A-430F, hard mask layers 470A-470F, and/or gate spacers 440A-440F similar to gate dielectrics 325A-325F, gate electrodes 330A-330F, hard mask layers 370A-370F, and/or gate spacers 340A-340F as described above with reference to FIGS. 2A-2E), epitaxial source/drain features 426A-426D (similar to epitaxial source/drain features 326A-326D described above with reference to FIGS. 2A-2E), an MLI feature 456 (similar to MLI feature 356 described above with reference to FIGS. 2A-2E), ILD layers 452, 454 (similar to ILD layers 352, 354 described above with reference to FIGS. 2A-2E), device-level contacts 460A-460H (similar to device-level contacts 360A-360H described above with reference to FIGS. 2A-2E), vias (not shown), and conductive lines (not shown).

Similar to SRAM cell 300, SRAM cell 400 includes six transistors: a pass-gate transistor PG-1, a pass-gate transistor PG-2, a pull-up transistor PU-1, a pull-up transistor PU-2, a pull-down transistor PD-1, and a pull-down transistor PD-2. N-type well 414 is disposed between the p-type wells 416A and 416B, where pull-up transistors PU-1, PU-2 are disposed over n-type well 414 and pass-gate transistors PG-1, PG-2 and pull-down transistors PD-1, PD-2 are disposed over respective p-type wells 416A and 416B. Pull-up transistors PU-1, PU-2 are p-type transistors, pass-gate transistors PG-1, PG-2 are n-type transistors, and pull-down transistors PD-1, PD-2 are n-type transistors. Transistors PU-1, PU-2, PG-1, PG-2, PD-1, and PD-2 of SRAM cell 400 are each configured in a way similar to corresponding transistors PU-1, PU-2, PG-1, PG-2, PD-1, and PD-2 of SRAM cell 300, as described above with reference to FIGS. 2A-2E. For example, pass-gate transistor PG-1 and pull-down transistor PD-1 each includes a portion of fin structure 420A disposed over p-type well 416A and a respective gate structure 450A, 450B disposed over channel regions of the fin structure 420A, such that the respective gate structure 450A, 450B interposes respective source/drain regions of the fin structure 420A; and pass-gate transistors PG-2 and pull-down transistor PD-2 each includes a portion of fin structure 420D disposed over p-type well 416B and a respective gate structure 450E, 450F disposed over a channel region of the fin structure 420D, such that the respective gate structure 450E, 450F interposes the respective source/drain regions of the fin structure 420D. The fin structures 420A and 420D of pass-gate transistors PG-1, PG-2 and/or pull-down transistors PD-1, PD-2 include p-type dopants and are electrically connected to respective p-type wells 416A and 416B. Pass-gate transistors PG-1, PG-2 and/or pull-down transistors PD-1, PD-2 further include n-type epitaxial source/drain features 426A and 426D (FIG. 3C). In other words, epitaxial source/drain features 426A and 426D of pass-gate transistors PG-1, PG-2 and/or pull-down transistors PD-1, PD-2 include n-type dopants. Gate structures 450A, 450B, 450E, 450F and/or epitaxial source/drain features 426A and 426D of pass-gate transistors PG-1, PG-2 and/or pull-down transistors PD-1, PD-2 are electrically connected to a voltage source (for example, $V_{SS}$) by MLI feature 456 (in particular, respective contacts 460A-460H, vias, and/or conductive lines disposed in ILD layers 452 and 454). In furtherance of the example, pull-up transistor PU-1 includes a portion of fin structure 420B disposed over n-type well 414 and gate structure 450D disposed over a channel region of the fin structure 420B, such that the gate structure 450D interposes source/drain regions of the fin structure 420B; and pull-up transistor PU-2 includes a portion of fin structure 420C disposed over n-type well 414 and gate structure 450C disposed over a channel region of the fin structure 420C, such that the respective gate structure 450C interposes source/drain regions of the fin structure 420C. The fin structures 420B, 420C of pull-up transistors PU-1, PU-2 include n-type dopants and are electrically connected to n-type well 414. Pull-up transistors PU-1, PU-2 further include p-type epitaxial source/drain features 426B and 426C (FIG. 3C). In other words, epitaxial source/drain features 426B and 426C of pull-up transistors PU-1, PU-2 include p-type dopants. Gate structures 450C and 450D and/or epitaxial source/drain features 426B and 426C of pull-up transistors PU-1, PU-2 are electrically connected to a voltage source (for example, VDD) by MLI feature 456 (in particular, respective contacts 460, vias, and/or conductive lines disposed in ILD layers 452 and 454).

SRAM cell 400 has a cell boundary 401. A cell size of SRAM cell 400 is the same as the cell size of SRAM cell 300. A cell size of an SRAM cell refers to the area it occupies on the semiconductor chip, defined by its cell boundary (i.e. cell boundary 401 for SRAM cell 400, and cell boundary 301 for SRAM cell 300). The cell size of an SRAM cell may be calculated from its relevant dimensions. For example, SRAM cell 400 is of a rectangular shape, and has a length 402 along the x-direction, and a width 404 along the y-direction. Accordingly, the cell size of the SRAM cell 400 may be calculated by multiplying the length 402 and width 404. The length 402 of SRAM cell 400 is substantially the same as the length 302 of SRAM cell 300; and the width 404 is substantially the same as the width 304 of SRAM cell 300. Furthermore, transistors of SRAM cell 400 may have features of the same or similar feature sizes as those corresponding features of transistors of SRAM cell 300. For example, each of n-type transistors PD-1 and PG-2 of SRAM cell 400 has channel layers 422A with a lateral width (or average lateral width) $w_A$-400; and each of n-type transistors PD-2 and PG-1 of SRAM cell 400 has channel layers 422D with a lateral width (or average lateral width)

$w_D$-400. In some embodiments, lateral width $w_A$-400 is about equal to lateral width $w_A$-300 of SRAM cell 300; and lateral width $w_D$-400 is about equal to lateral width $w_D$-300 of SRAM cell 300. Similarly, each of p-type transistors PU-1 and PU-2 of SRAM cell 400 has channel layers 422B and 422C, respectively, with a lateral width (or average lateral width) of $w_B$-400 and $w_C$-400, respectively. In some embodiments, lateral width $w_B$-400 is about equal to lateral width $w_B$-300 of SRAM cell 300; and lateral width $w_C$-400 is about equal to lateral width $w_C$-300 of SRAM cell 300. Similar to SRAM cell 300, lateral widths of features of the same doping types are about equal to each other. For example, lateral width $w_A$-400 is about equal to lateral width $w_A$-400; and lateral width $w_B$-400 is about equal to lateral width $w_C$-400. Additionally, similar to SRAM cell 300, the channel layers 422A-422D of the transistors PU-1, PU-2, PG-1, PG-2, PD-1, and PD-2 of SRAM cell 400 have thicknesses about equal to one another, and equal to thickness t-400. The thickness t-400 of channel layers of SRAM cell 400 may be about the same as the thickness t-300 of channel layers of SRAM cell 300. Accordingly, similar to SRAM cell 300, the lateral widths $w_A$-400 and $w_D$-400 are about equal to or larger than the thickness t-400. In some embodiments, a ratio of the lateral width $w_A$-400 (or $w_D$-400) to the thickness t-400 is about 1 to about 10. In some embodiments, the lateral widths of channel layers in p-type doped regions (for n-type transistors) may be greater than the lateral widths of channel layers in n-type doped regions (for p-type transistors). For example, a ratio of the lateral width $w_A$-400 (or $w_D$-400) to the lateral width $w_B$-400 (or $w_C$-400) is about 1 to about 5. As described above, the larger lateral width for channel layers of the n-type transistors increases the carrier flow and improves performances in high-speed applications. In some embodiments, SRAM cell 400 may have a feature size (such as lateral width $w_A$-400 of channel layer 422A) smaller than the corresponding feature of SRAM cell 300 (such as lateral width $w_A$-300 of channel layer 322A). For example, a ratio of $w_A$-300 to $w_A$-400 may be about 1 to about 1.2. The different lateral widths of the channel layers between SRAM cells 300 and 400 allow them to be adapted to different design needs, without changing their relative cell sizes.

As discussed above, though SRAM cell 400 includes similar features as SRAM cell 300, the features may have different physical dimensions, material compositions, and/or performance characteristics, from those of SRAM cell 300. For example, in the depicted embodiment, gate electrodes of the transistors PD-1, PG-1, PD-2, PG-2, PU-1, and PU-2 of SRAM cell 400 have different physical dimensions and/or material compositions from gate electrodes of the corresponding transistors PD-1, PG-1, PD-2, PG-2, PU-1, and PU-2 of SRAM cell 300. As a result, a threshold voltage of n-type transistors PD-1, PD-2 of SRAM cell 400 is different than a threshold voltage of n-type transistors PD-1, PD-2 of SRAM cell 300; a threshold voltage of n-type transistors PG-1, PG-2 of SRAM cell 400 is different than a threshold voltage of n-type transistors PG-1, PG-2 of SRAM cell 300; and/or a threshold voltage of p-type transistors PU-1, PU-2 of SRAM cell 400 is different than a threshold voltage of p-type transistors PU-1, PU-2 of SRAM cell 300. In some embodiments, the threshold voltage difference between the n-type transistors of the same type or the p-type transistors of the same type is about 30 mV to about 120 mV. Configuring a specific SRAM cell (such as SRAM cell 300 or 400) with transistors having lower threshold voltages (compared to transistors of the same type of other SRAM cells on the same memory chip) provides the specific SRAM cell with transistors that can be turned on at a lower power. Accordingly, the specific SRAM cell may be selectively invoked in appropriate applications, such as a high-speed, or a super-high-speed application. Conversely, configuring a specific SRAM cell (such as SRAM cell 300 or 400) with transistors having a higher threshold voltage (compared to transistors of the same type of other SRAM cells on the same memory chip) provides the specific SRAM cell with transistors that may have lower standby leakage. Accordingly, the specific SRAM cell may be selectively invoked in appropriate applications, such as a low-power application.

In some embodiments, a threshold voltage of the transistors of SRAM cell 300 is lower than a threshold voltage of the same type of transistors of SRAM cell 400. This may be accomplished by tuning a thickness of gate electrode layers of the transistors of SRAM cell 300 and SRAM cell 400 differently. As described above with respect to FIGS. 2A-2E, the gate electrodes of the transistors of SRAM cell 300 may include a combination of p-type work function layer (such as a TiN layer), n-type work function layer (such as a TiAl layer), capping layer (such as a TaN layer), and metal fill layer (such as a W layer). In some embodiments, the gate electrodes of one or more transistors of SRAM cell 300, as well as the gate electrodes of one or more transistors of SRAM cell 400, each include a combination of a TiN layer, a TiAl layer, a TaN layer, and a W layer. The thicknesses of the corresponding gate layers may be different between SRAM cell 400 and SRAM cell 300 to achieve different performance characteristics from the SRAM cells with the same types of transistors. As described above, a thicker TiN layer leads to an increased threshold voltage for n-type transistors PG-1, PD-1, PD-2, and PG-2, and conversely, a thinner TiN layer leads to an increased threshold voltage for p-type transistors PU-1 and PU-2. In some embodiments, a thickness of a TiN layer of gate electrodes of n-type transistors of SRAM cell 400 (such as gate electrodes 430A, 430B, 430E, and 430F) is greater than a thickness of a TiN layer of gate electrodes of corresponding n-type transistors of SRAM cell 300 (such as gate electrodes 330A, 330B, 330E, and 330F). For example, gate electrodes 430B, 430E of pull-down transistors PD-1, PD-2 of SRAM cell 400 may include a TiN layer with a thickness of about 4 nm to about 30 nm, while gate electrodes 330B, 330E of pull-down transistors PD-1, PD-2 of SRAM cell 300 may include a TiN layer with a thickness of about 0.5 nm to about 4 nm. For example, gate electrodes 430A, 430F of pass-gate transistors PG-1, PG-2 of SRAM cell 400 may include a TiN layer with a thickness of about 1 nm to about 6 nm, while gate electrodes 330A, 330F of pass-gate transistors PG-1, PG-2 of SRAM cell 300 may include a TiN layer with a thickness of about 5 nm to about 40 nm. In some implementations, a gate electrode of an n-type transistor of SRAM cell 400 has a TiN layer thickness greater than a TiN layer thickness of a gate electrode of an n-type transistor of the same type of SRAM cell 300 by about 0.5 nm to about 3 nm. Accordingly, a threshold voltage of n-type transistors PG-1, PD-1, PD-2, and/or PG-2 of SRAM cell 400 is greater than a threshold voltage of the corresponding n-type transistors PG-1, PD-1, PD-2, and/or PG-2 of SRAM cell 300.

In some embodiments, a thickness of a TiN layer of gate electrodes of p-type transistors of SRAM cell 400 (such as gate electrodes 430C, 430D) is less than a thickness of a TiN layer of gate electrodes of corresponding p-type transistors of SRAM cell 300 (such as gate electrodes 330C, 330D). For example, gate electrodes 430C, 430D of pull-up transistors PU-1, PU-2 of SRAM cell 400 may include a TiN layer with a thickness of about 0.5 nm to about 4 nm, while gate electrodes 330C, 330D of pull-up transistors PU-1, PU-2 of SRAM cell 300 may include a TiN layer with a thickness of about 1 nm to about 6 nm. In some implementations, a gate electrode of a p-type transistor of SRAM cell 400 has a TiN layer thickness less than a TiN layer thickness of a gate electrode of a p-type transistor of the same type of SRAM cell 300 by about 0.5 nm to about 3 nm. Accordingly, a threshold voltage of p-type transistors PU-1 and/or PU-2 of SRAM cell 400 is greater than a threshold voltage of the corresponding p-type transistors PU-1, PU-2 of SRAM cell 300.

In some embodiments, the lower threshold voltage of SRAM cell 300 compared to SRAM cell 400 is accomplished by tuning a material composition of a gate dielectric of the transistors. As described above, incorporating a lanthanum dopant into a gate dielectric of an n-type transistor (such as PD-1, PD-2, PG-1, and PG-2) may lower the threshold voltage of the n-type transistor as compared to the n-type transistor without the lanthanum element in the gate dielectric; and incorporating a lanthanum element into a gate dielectric of a p-type transistor (such as PU-1, PU-2) may increase the threshold voltage of the p-type transistor as compared to the p-type transistor without the lanthanum dopant in the gate dielectric. In some embodiments, the gate dielectric (325A, 325B, 325E, and/or 325F) of n-type transistors (such as PD-1, PD-2, PG-1, and/or PG-2) of SRAM cell 300 includes a lanthanum dopant. For example, gate dielectrics 325B, 325E of pull-down transistors PD-1, PD-2 of SRAM cell 300 include a lanthanum dopant at an atomic percentage (relative to the total number of atoms in the gate dielectric) of about 0.5% to about 5%, while gate dielectrics 425B, 425E of pull-down transistors PD-1, PD-2 of SRAM cell 400 do not include a lanthanum dopant. Alternatively, gate dielectrics 425B, 425E of pull-down transistors PD-1, PD-2 of SRAM cell 400 include a lanthanum dopant at a smaller atomic percentage than the gate dielectrics 325B, 325E of pull-down transistors PD-1, PD-2 of SRAM cell 300. For another example, gate dielectrics 325A, 325F of pass-gate transistors PG-1, PG-2 of SRAM cell 300 include a lanthanum dopant at an atomic percentage (relative to the total number of atoms in the gate dielectric) of about 0.5% to about 5%, while gate dielectrics 425A, 425F of pass-gate transistors PG-1, PG-2 of SRAM cell 400 do not include a lanthanum dopant. Alternatively, gate dielectrics 425A, 425F of pass-gate transistors PG-1, PG-2 of SRAM cell 400 include a lanthanum dopant at a smaller concentration than the gate dielectrics 325A, 325F of pass-gate transistors PG-1, PG-2 of SRAM cell 300. Accordingly, a threshold voltage of n-type transistors PD-1, PD-2, PG-1, and/or PG-2 of SRAM cell 400 is greater than a threshold voltage of the corresponding n-type transistors PD-1, PD-2, PG-1, and PG-2 of SRAM cell 300.

In some embodiments, the gate dielectric (325C and/or 325D) of p-type transistors (such as PU-1, PU-2) of SRAM cell 300 does not include a lanthanum dopant, while the gate dielectric (425C and/or 425D) of p-type transistors (such as PU-1, PU-2) of SRAM cell 400 include a lanthanum dopant. For example, gate dielectrics 425C and/or 425D of pull-up transistors PU-1, PU-2 of SRAM cell 400 include a lanthanum dopant at an atomic percentage (relative to the total number of atoms in the gate dielectric) of about 0.5% to about 5%. Alternatively, gate dielectrics 325C, 325D of pull-up transistors PU-1, PU-2 of SRAM cell 300 include a lanthanum dopant at a smaller concentration than the gate dielectrics 425C, 425D of pull-up transistors PG-1, PG-2 of SRAM cell 400. Accordingly, a threshold voltage of p-type transistors PU-1 and/or PU-2 of SRAM cell 400 is greater than a threshold voltage of the corresponding p-type transistors PU-1 and/or PU-2 of SRAM cell 300.

In some embodiments, the lower threshold voltage of SRAM cell 300 as compared to SRAM cell 400 is achieved by adjusting both a thickness of a gate electrode layer, and by adjusting a material composition of a gate dielectric. For example, a thickness of a TiN layer of gate electrodes of n-type transistors of SRAM cell 400 (such as gate electrodes 430A, 430B, 430E, and 430F) is greater than a thickness of a TiN layer of gate electrodes of corresponding n-type transistors of SRAM cell 300 (such as gate electrodes 330A, 330B, 330E, and 330F). Meanwhile, the gate dielectric (325A, 325B, 325E, and/or 325F) of n-type transistors (such as PD-1, PD-2, PG-1, and/or PG-2) of SRAM cell 300 includes a lanthanum dopant at an atomic percentage (relative to the total number of atoms in the gate dielectric) of about 0.5% to about 5%. while gate dielectrics 425B, 425E of pull-down transistors PD-1, PD-2 of SRAM cell 400 do not include a lanthanum dopant. Accordingly, a threshold voltage of n-type transistors PG-1, PD-1, PD-2, and/or PG-2 of SRAM cell 400 is greater than a threshold voltage of the corresponding n-type transistors PG-1, PD-1, PD-2, and/or PG-2 of SRAM cell 300. In furtherance of the example, a thickness of a TiN layer of gate electrodes of p-type transistors of SRAM cell 400 (such as gate electrodes 430C, 430D) is less than a thickness of a TiN layer of gate electrodes of corresponding p-type transistors of SRAM cell 300 (such as gate electrodes 330C, 330D). Meanwhile, the gate dielectric (325C and/or 325D) of p-type transistors (such as PU-1, PU-2) of SRAM cell 300 does not include a lanthanum dopant, while the gate dielectric (425C and/or 425D) of p-type transistors (such as PU-1, PU-2) of SRAM cell 400 include a lanthanum dopant at an atomic percentage (relative to the total number of atoms in the gate dielectric) of about 0.5% to about 5%. Accordingly, a threshold voltage of p-type transistors PU-1 and/or PU-2 of SRAM cell 400 is greater than a threshold voltage of the corresponding p-type transistors PU-1 and/or PU-2 of SRAM cell 300.

In some embodiments, the SRAM cell 400 is connected to a write-assist circuit. As described above, a write-assist circuit improves the write margin when the SRAM cell by itself does not operate at a sufficiently high speed. For example, as described above, n-type pass-gate transistors PG-1 and PG-2 of SRAM cell 400 have channel layers with lateral widths smaller than those of SRAM cell 300. Therefore, n-type pass-gate transistors PG-1 and PG-2 of SRAM cell 400 have higher threshold voltages than those of SRAM cell 300. A higher threshold voltage generally results in a reduced voltage headroom (defined as the separation between the supply voltage and the threshold voltage), which in turn results in a reduced maximum drain current ($I_{on}$), and eventually leads to degraded writing capability. Accordingly, in some embodiments, unlike SRAM cell 300, SRAM cell 400 may be connected to a write-assist circuit such that it may operate within acceptable parameters. Further details on the write-assist circuits are provided in U.S. Pat. No. 9,576,644, entitled "Integrated Circuit Chip having Two Types of Memory Cells" to Jhon Jhy Liaw, and U.S. Pat. No. 9,935,001, entitled "Methods of Forming an Integrated Circuit Chip having Two Types of Memory Cells" to Jhon Jhy Liaw. Both U.S. Pat. Nos. 9,576,644 and 9,935,001 are herein incorporated by reference in their entirety. Therefore, in the depicted embodiment, the memory chip 10 includes SRAM cell 300 that is not connected to a write-assist circuit and SRAM cell 400 that is connected to a write-assist circuit.

FIGS. 4A-4E illustrate detailed structures for SRAM cell 500. SRAM cell 500 includes similar features as SRAM cell 300, although the features may have different physical dimensions, material compositions, and/or performance characteristics from those of SRAM cell 300. These similarities and differences are described in more detail below.

SRAM cell 500 includes a substrate 512 having various doped regions disposed therein, such as an n-type doped region 514 and p-type doped regions 516A and 516B. Substrate 512, n-type doped region 514, and p-type doped regions 516A and 516B are respectively similar to substrate 312, n-type doped region 314, and p-type doped regions 316A and 316B described above with reference to FIGS. 2A-2E. SRAM cell 500 further includes various features disposed over n-type doped region 514 and p-type doped regions 516A and 516B, where the various features are configured to achieve desired functionalities. For example, SRAM cell 500 includes fin structures 520A-520D, each having base fins 521A-521D (similar to fin structures 320A-320D having base fins 321A-321D described above with reference to FIGS. 2A-2E) and channel layers 522A-522D (similar to fin structures 320A-320D having channel layers 322A-322D described above with reference to FIGS. 2A-2E). Channel layers 522A, 522B, 522C, and 522D each has a respective lateral width $w_A$-500, $w_B$-500, $w_C$-500, and $w_D$-500 (similar to lateral widths $w_A$-300, $w_B$-300, $w_C$-300, and $w_D$-300 described above with reference to FIGS. 2A-2E) and a thickness t-500 (similar to the thickness t-300 described above with reference to FIGS. 2A-2E). SRAM cell 500 further includes isolation feature 524 (similar to isolation feature 324 described above with reference to FIGS. 2A-2E), gate structures 550A-550F (similar to gate structures 350A-350F described above with reference to FIGS. 2A-2E) (including, for example, gate dielectrics 525A-525F, gate electrodes 530A-530F, hard mask layers 570A-570F, and/or gate spacers 540A-540F similar to gate dielectrics 325A-325F, gate electrodes 330A-330F, hard mask layers 370A-370F, and/or gate spacers 340A-340F as described above with reference to FIGS. 2A-2E), epitaxial source/drain features 526A-526D (similar to epitaxial source/drain features 326A-326D described above with reference to FIGS. 2A-2E), an MLI feature 556 (similar to MLI feature 356 described above with reference to FIGS. 2A-2E), ILD layers 552, 554 (similar to ILD layers 352, 354 described above with reference to FIGS. 2A-2E), device-level contacts 560A-560H (similar to device-level contacts 360A-360H described above with reference to FIGS. 2A-2E), vias (not shown), and conductive lines (not shown).

Similar to SRAM cell 300, SRAM cell 500 includes six transistors: a pass-gate transistor PG-1, a pass-gate transistor PG-2, a pull-up transistor PU-1, a pull-up transistor PU-2, a pull-down transistor PD-1, and a pull-down transistor PD-2. N-type well 514 is disposed between the p-type wells 516A and 516B, where pull-up transistors PU-1, PU-2 are disposed over n-type well 514 and pass-gate transistors PG-1, PG-2 and pull-down transistors PD-1, PD-2 are disposed over respective p-type wells 516A and 516B. Pull-up transistors PU-1, PU-2 are p-type transistors, pass-gate transistors PG-1, PG-2 are n-type transistors, and pull-down transistors PD-1, PD-2 are n-type transistors. Transistors PU-1, PU-2, PG-1, PG-2, PD-1, and PD-2 of SRAM cell 500 are each configured in a way similar to corresponding transistors PU-1, PU-2, PG-1, PG-2, PD-1, and PD-2 of SRAM cell 300, as described above with reference to FIGS. 2A-2E. For example, pass-gate transistor PG-1 and pull-down transistor PD-1 each includes a portion of fin structure 520A disposed over respective p-type well 516A and a respective gate structure 550A, 550B disposed over channel regions of the fin structure 520A, such that the respective gate structure 550A, 550B interposes respective source/drain regions of the fin structure 520A; and pass-gate transistors PG-2 and pull-down transistor PD-2 each includes a portion of fin structure 520D disposed over p-type well 516B and a respective gate structure 550E, 550F disposed over a channel region of the fin structure 520D, such that the respective gate structure 550E, 550F interposes the respective source/drain regions of the fin structure 520D. The fin structures 520A and 520D of pass-gate transistors PG-1, PG-2 and/or pull-down transistors PD-1, PD-2 include p-type dopants and are electrically connected to respective p-type wells 516A and 516B. Pass-gate transistors PG-1, PG-2 and/or pull-down transistors PD-1, PD-2 further include n-type epitaxial source/drain features 526A and 526D (FIG. 4C). In other words, epitaxial source/drain features 526A and 526D of pass-gate transistors PG-1, PG-2 and/or pull-down transistors PD-1, PD-2 include n-type dopants. Gate structures 550A, 550B, 550E, 550F and/or epitaxial source/drain features 526A and 526D of pass-gate transistors PG-1, PG-2 and/or pull-down transistors PD-1, PD-2 are electrically connected to a voltage source (for example, $V_{SS}$) by MLI feature 556 (in particular, respective contacts 560A-560H, vias, and/or conductive lines disposed in ILD layers 552 and 554). In furtherance of the example, pull-up transistor PU-1 includes a portion of fin structure 520B disposed over n-type well 514 and gate structure 550D disposed over a channel region of the fin structure 520B, such that the gate structure 550D interposes source/drain regions of the fin structure 520B; and pull-up transistor PU-2 includes a portion of fin structure 520C disposed over n-type well 514 and gate structure 550C disposed over a channel region of the fin structure 520C, such that the respective gate structure 550C interposes source/drain regions of the fin structure 520C. The fin structures 520B, 520C of pull-up transistors PU-1, PU-2 include n-type dopants and are electrically connected to n-type well 514. Pull-up transistors PU-1, PU-2 further include p-type epitaxial source/drain features 526B and 526C (FIG. 4C). In other words, epitaxial source/drain features 526B and 526C of pull-up transistors PU-1, PU-2 include p-type dopants. Gate structures 550C and 550D and/or epitaxial source/drain features 526B and 526C of pull-up transistors PU-1, PU-2 are electrically connected to a voltage source (for example, $V_{DD}$) by MLI feature 556 (in particular, respective contacts 560, vias, and/or conductive lines disposed in ILD layers 552 and 554).

Each transistor PD-1, PD-2, PG-1, PG-2, PU-1, and PU-2 of SRAM cell 500 may have the same materials as the corresponding transistors of SRAM cell 300 in its gate stack. For example, gate electrodes 550A-550F of SRAM cell 500 may each have same materials as corresponding gate electrode 350A-350F of SRAM cell 300. Alternatively, each transistor of SRAM cell 500 may have same materials as a corresponding transistor of SRAM cell 400 in its gate stack. For example, gate electrodes 550A-550F of SRAM cell 500 may each have same materials as corresponding gate electrode 450A-450F of SRAM cell 400. Furthermore, each transistor of SRAM cell 500 may have materials different than a corresponding transistor of SRAM cell 300 and different than a corresponding transistor of SRAM cell 400 in its gate stack. For example, gate electrodes 550A-550F of SRAM cell 500 may each have materials different than corresponding gate electrode 350A-350F of SRAM cell 300 and different than corresponding gate electrode 450A-450F of SRAM cell 400.

SRAM cell 500 has a cell boundary 501. Unlike SRAM cell 400, a cell size of SRAM cell 500 is different, e.g. greater, than the cell size of SRAM cell 300. In other words, SRAM cell 500 occupies an area on the semiconductor chip that is different, e.g. greater, than that occupied by the SRAM cell 300. For example, SRAM cell 500 may have a cell area at least 10% greater than SRAM cell 300 (and SRAM cell 400, if present). SRAM cell 500 may have a length 502 along the x-direction, and a width 504 along the y-direction. In some embodiments, the length 502 of SRAM cell 500 is larger than the length 302 of SRAM cell 300, and the width 504 is about the same as the width 304 of SRAM cell 300. For example, a ratio of the length 502 of SRAM cell 500 to length 302 of SRAM cell 300 is between about 1.1 and 1.3. Larger cell area allows larger features to be formed. For example, a gate electrode of a transistor of SRAM cell 500 may have channel layers with lateral widths larger than a gate electrode of a transistor of the same type of SRAM cell 300. As described above, n-type transistor PD-1 and PG-2 of SRAM cell 500 each has multiple layers of channels (522A) with a lateral width (or average lateral width) $w_A$-500; n-type transistors PD-2 and PG-1 of SRAM cell 500 each has multiple layers of channels (522D) with a lateral width (or average lateral width) $w_D$-500. Similarly, p-type transistors PU-1 and PU-2 of SRAM cell 500 each has multiple layers of channels (522B and 522C, respectively) with a lateral width (or average lateral width) of $w_B$-500 and $w_C$-500, respectively. Similar to SRAM cell 300, lateral widths of features of the same doping types are about equal to each other. For example, lateral width $w_A$-500 is about equal to lateral width $w_D$-500; and lateral width $w_B$-500 is about equal to lateral width $w_C$-500. Additionally, similar to SRAM cell 300, the channel layers of the transistors PU-1, PU-2, PG-1, PG-2, PD-1, and PD-2 of SRAM cell 500 have thicknesses about equal to one another, and equal to t-500. In some embodiments, lateral width $w_A$-500 is larger than $w_A$-300 of SRAM cell 300; and lateral width $w_D$-500 is larger than $w_D$-300 of SRAM cell 300. In some embodiments, lateral width $w_B$-500 is equal to or larger than $w_B$-300 of SRAM cell 300; and lateral width $w_C$-500 is equal to or larger than $w_C$-300 of SRAM cell 300. For example, a ratio of the lateral width $w_A$-500 (or $w_D$-500) to the lateral width $w_A$-300 (or $w_D$-300) is about 1.2 to about 3; and a ratio of the lateral width $w_B$-500 (or $w_C$-500) to the lateral width $w_B$-300 (or $w_C$-300) is about 1 to about 1.3. As described above, a wider channel layer allows greater $I_{on}$ and permits SRAM cell 500 to operate at an even higher speed than SRAM cell 300, for example, at a speed of about 2 GHz to about 6 GHz. Accordingly, SRAM cell 500 may be utilized in higher-speed applications (such as HPC L1 cache products) than SRAM cell 300. Additionally, the thickness t-500 of features of SRAM cell 500 may be about the same as the thickness t-300 of features of SRAM cell 300. Accordingly, the lateral widths $w_A$-500 and $w_D$-500 are larger than the thickness t-500. A ratio of the lateral width $w_A$-500 (or $w_D$-500) to the thickness t-500 is from about 1.2 to about 20; and a ratio of the lateral width $w_B$-500 (or $w_C$-500) to the thickness t-500 is from about 1 to about 13.

Referring back to FIG. 1A, as described above, SRAM chip 10 may include two SRAM cells 300 and 400 which resemble each other with respect to features they include. In some embodiments, SRAM cell 300 and 400 may have a same cell size, such as having same lengths and same widths. For both SRAM cells 300 and 400, lateral widths of channel layers of an n-type transistor may be larger than lateral widths of channel layers of a p-type transistor of the same type. The larger channel widths for an n-type transistor allows higher $I_{on}$ and greater read/write speeds. Meanwhile, one or more transistors of SRAM cell 300 may have threshold voltage less than corresponding transistors of SRAM cell 400. Lower threshold voltage allows the transistors of SRAM cell 300 to respond faster such that SRAM cell 300 may be particularly suitable for high-speed applications; while the higher threshold voltage allows the transistors of SRAM cell 400 to have lower leakage current such that SRAM cell 400 may be particularly suitable for low-power applications. The different threshold voltage may be achieved by tuning the thickness of a gate electrode layer (such as a TiN layer), or may be achieved by tuning the material composition (such as the presence/absence of and/or amounts of a lanthanum dopant) of gate dielectric. Furthermore, SRAM cell 300 may not be connected to a write-assist circuit, while SRAM cell 400 may be connected to a write-assist circuit. In some embodiments, SRAM chip 10 further includes a third SRAM cell 500. SRAM cell 500 may be similar to SRAM cell 300 in many aspects, such as feature included, and/or material compositions. However, SRAM cell 500 may have a larger cell size, for example, a larger cell length 502. The larger cell length allows channel layers of the transistors of SRAM cell 500 to be greater than corresponding channels in SRAM cell 300, such that the transistors may function even faster than SRAM cell 300. This makes SRAM cell 500 particularly suitable for super-high-speed applications (such as HPC cache L-1 applications). As described above, SRAM cells 300, 400 and 500 (if present) may be in any relative positions and/or relative orientations on SRAM chip 10. In some embodiments, SRAM chip 10 may be used for multiple applications (such as high-speed applications, low-power applications, and/or superhigh-speed applications). When any particular application is desired, the corresponding SRAM cell (such as SRAM cell 300 for high-speed application, SRAM cell 400 for low-power application, and SRAM cell 500 for super-high-speed application) may be invoked without resorting to different SRAM chips. Additionally, SRAM chip 10 includes built-in flexibility such that different performance characteristics may be tuned without changing the design. For example, depending on target applications and design needs, a threshold voltage may be tuned by simply tuning a thickness of gate electrode layer and/or a material composition (such as the lanthanum dopant concentration) of a gate dielectric.

Figure 5:
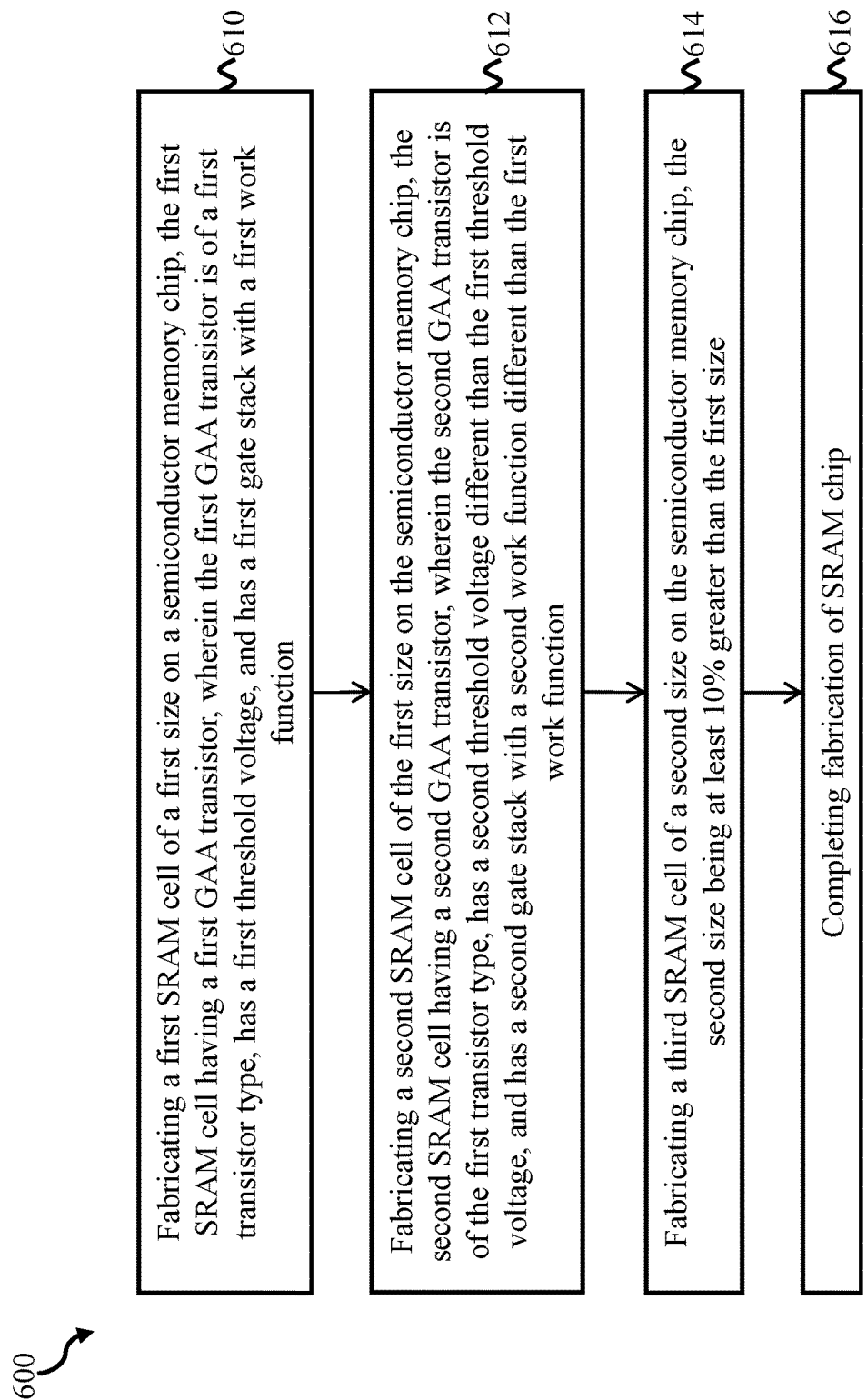
FIG. 5 is a flow chart of a method for fabricating a memory chip according to various aspects of the present disclosure.

FIG. 5 is a flow chart of a method 600 for fabricating a semiconductor memory chip having SRAM cells optimized for more than one application according to various aspects of the present disclosure. At block 610, method 600 includes fabricating a first SRAM cell of a first cell size on a semiconductor memory chip (for example, memory chip 10). The first SRAM cell includes a first GAA transistor of a first transistor type, has a first threshold voltage, and has a first gate stack with a first work function. At block 620, method 600 includes fabricating a second SRAM cell of the first cell size on the same semiconductor memory chip. The second SRAM cell includes a second GAA transistor of the first transistor type, has a second threshold voltage different than the first threshold voltage, and has a second gate stack with a second work function different than the first work function. At block 630, method 600 optionally includes fabricating a third SRAM cell of a second cell size on the same semiconductor memory chip. The second cell size is at least 10% greater than the first cell size. At block 640, method 600 includes further steps to complete fabricating the memory chip. In some implementations, the first threshold voltage of the first GAA transistor is less than the second threshold voltage by at least 30 mV. In some implementations, the first gate stack includes a first gate electrode having a first TiN layer of a first thickness, and the second gate stack includes a second gate electrode having a second TiN layer of a second thickness different than the first thickness. In some implementations, the first gate stack includes a first gate dielectric having a lanthanum dopant, and the second gate stack is free of a lanthanum dopant. Additional steps can be provided before, during, and after method 600, and some of the steps described can be moved, replaced, or eliminated for additional embodiments of method 600.

The present disclosure provides for many different embodiments. Memory chips for multiple applications are disclosed herein for improving performance of memory chips in diverse applications, such as low-power applications, high-speed applications, and superhigh-speed applications. An exemplary semiconductor memory chip includes a first static random access memory (SRAM) cell and a second SRAM cell. The first SRAM cell has a first GAA transistor, and the second SRAM cell has a second GAA transistor. The first and the second SRAM cells have a same cell size, and the first and the second GAA transistors are of a same transistor type. Moreover, the first GAA transistor has a first threshold voltage and the second GAA transistor has a second threshold voltage. The second threshold voltage is different than the first threshold voltage. Furthermore, the first GAA transistor has a first gate stack and the second GAA transistor has a second gate stack. The first gate stack has a first work function value, and the second gate stack has a second work function value. The second work function value is different than the first work function value.

In some embodiments, the first gate stack has a first gate electrode. The first gate electrode includes titanium nitride (TiN), tantalum nitride (TaN), titanium aluminum (TiAl), tungsten (W), or a combination thereof. The second gate stack has a second gate electrode. The second gate electrode includes TiN, TaN, TiAl, W, or a combination thereof. The material configuration of the first gate electrode is different than the material configuration of the second gate electrode. In some embodiments, the first gate electrode includes a first TiN layer of a first TiN thickness, and the second gate electrode includes a second TiN layer of a second TiN thickness. The first TiN thickness is different than the second TiN thickness. In some embodiments, the first threshold voltage of the first GAA transistor is less than the second threshold voltage of the second GAA transistor by about 30 mV to about 120 mV. In some embodiments, the first and the second GAA transistors are n-type transistors. In some embodiments, the second SRAM cell is connected to a write-assist circuit while the first SRAM cell is not connected to a write-assist circuit. In some embodiments, the first SRAM cell further includes a third GAA transistor, and the second SRAM cell further includes a fourth GAA transistor. The first and the second GAA transistors are first type transistors, and the third and fourth GAA transistors are second type transistors, where the first type is different than the second type. The third GAA transistor has a third threshold voltage, and the fourth GAA transistor has a fourth threshold voltage. The fourth threshold voltage is different than the third threshold voltage. In some embodiments, the first GAA transistor includes a first stack of semiconductor layers, the second GAA transistor includes a second stack of semiconductor layers, and the third GAA transistor includes a third stack of semiconductor layers. The first stack of semiconductor layers are of a first channel width and a first channel thickness, the second stack of semiconductor layers are of a second channel width and a second channel thickness and the third stack of semiconductor layers are of a third channel width and a third channel thickness. The first channel width is about equal to the second channel width, and the first channel thickness is about equal to the second channel thickness and the third channel thickness. Moreover, a ratio of the first channel width to the first channel thickness is about 1.2 to about 10, and a ratio of the first channel width to the third channel width is about 1.2 to about 5. In some embodiments, the first gate stack has a first gate dielectric that includes a lanthanum dopant, and the second gate stack has a second gate dielectric that is free of the lanthanum dopant.

An exemplary semiconductor memory chip includes a first static random access memory (SRAM) cell and a second SRAM cell on the semiconductor memory chip. The first SRAM cell extends lengthwise along a first direction, and has a first dimension along the first direction. The first SRAM cell further includes a first transistor and a second transistor. The first transistor is of a first type and is formed over a first region of a substrate doped with a first dopant. The second transistor is of a second type and is formed over a second region of the substrate doped with a second dopant, where the second type is different than the first type. The second SRAM cell has the first dimension along a second direction. The second SRAM cell includes a third transistor and a fourth transistor. The third transistor is of the first type and is formed over a third region of the substrate doped with the first dopant, and the fourth transistor is of the second type and is formed over a fourth region of the substrate doped with the second dopant. The first, the second, the third, and the fourth transistors each has a first, a second, a third, and a fourth threshold voltage, respectively, where the first threshold voltage is different than the third threshold voltage, and the second threshold voltage is different than the fourth threshold voltage. Moreover, the first, the second, the third, and the fourth transistors each includes a first, a second, a third, and a fourth stack of semiconductor layers, respectively. The first, the second, the third, and the fourth stack of semiconductor layers each has a first, a second, a third, and a fourth channel width, respectively, where the first channel width is different than the second channel width, the first channel width is about the same as the third channel width, and the second channel width is about the same as the fourth channel width. Furthermore, the first, the second, the third, and the fourth transistors each includes a first, a second, a third, and a fourth gate electrode, respectively. The gate electrodes is each formed over and wrapping the respective stack of semiconductor layers, where the first, the second, the third, and the fourth gate electrodes each is different from one another.

In some embodiments, the first threshold voltage of the first transistor is less than the third threshold voltage of the third transistor by at least about 30 mV; and the second threshold voltage of the second transistor is less than the fourth threshold voltage of the fourth transistor by at least about 30 mV. In some embodiments, each layer of the first stack of semiconductor layers has a first channel thickness. A ratio of the first channel width to the first channel thickness is about 1.2 to about 10. A ratio of the first channel width to the second channel width is about 1.2 to about 5. And a ratio of the first channel width to the third channel width is about 1 to about 1.2. In some embodiments, the first gate electrode includes a first TiN layer of a first TiN thickness, the third gate electrode includes a second TiN layer of a second TiN thickness, and the first TiN thickness is less the second TiN thickness. Moreover, the second gate electrode includes a third TiN layer of a third TiN thickness, the fourth gate electrode includes a fourth TiN layer of a fourth TiN thickness, and the third TiN thickness is greater the fourth TiN thickness. In some embodiments, the semiconductor memory chip further includes a first gate dielectric layer disposed between the first gate electrode and each of the first semiconductor layers, and a second gate dielectric layer disposed between the third gate electrode and each of the third semiconductor layers. The first gate dielectric layer includes a lanthanum dopant; and the second gate dielectric layer is free of the lanthanum dopant.

An exemplary semiconductor memory chip includes a first static random access memory (SRAM) cell configured with first performance characteristics, a second SRAM cell configured with second performance characteristics, and a third SRAM cell configured with third performance characteristics. The first SRAM cell includes a first GAA pull-down transistor and a first GAA pass-gate transistor. The second SRAM cell includes a second GAA pull-down transistor and a second GAA pass-gate transistor. The third SRAM cell includes a third GAA pull-down transistor and a third GAA pass-gate transistor. The first performance characteristics are different than the second performance characteristics and the third performance characteristics. The first and the second SRAM cells each has a first cell size, and the third SRAM cell has a second cell size that is greater than the first cell size. The first GAA pull-down transistor and the first GAA pass-gate transistor each includes a first gate electrode material with a first work function value. The second GAA pull-down transistor and the second GAA pass-gate transistor each includes a second gate electrode material with a second work function value, where the second work function value is different than the first work function value. The third GAA pull-down transistor and the third GAA pass-gate transistor each includes the first gate electrode material with the first work function value.

In some embodiments, the second cell size is greater than the first cell size by at least 10%. In some embodiments, the first GAA pull-down transistor includes channel layers having a first width; the second GAA pull-down transistor includes channel layers having the first width; the third GAA pull-down transistor includes channel layers having a second width. The second width is greater than the first width by at least 20%. In some embodiments, the first SRAM cell includes a first GAA pull-up transistor and the second SRAM cell includes a second GAA pull-up transistor. The first GAA pull-up transistor has a third gate electrode material with a third work function value; and the second GAA pull-up transistor has a fourth gate electrode material with a fourth work function value, where the third gate electrode material is different than the fourth gate electrode material; and the third work function value is different than the fourth work function value. In some embodiments, the first GAA pull-down transistor has a first threshold voltage, and the second GAA pull-down transistor has a second threshold voltage, where the first threshold voltage is less than the second threshold voltage by at least 30 mv. In some embodiments, the first GAA pull-down transistor operates at a first speed and a first power, the second GAA pull-down transistor operates at a second speed and a second power, and the third GAA pull-down transistor operates at a third speed and a third power. The first speed is greater than the second speed, the third speed is greater than the first and the second speeds, and the second power is less than the first and third powers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory chip, comprising:
   a first memory cell comprising:
      a first pull-up transistor including a first gate stack having a first gate dielectric layer wrapping around each of a first plurality of nanostructures,
      a first pull-down transistor including a second gate stack having a second gate dielectric layer wrapping around each of a second plurality of nanostructures; and
   a second memory cell comprising:
      a second pull-up transistor including a third gate stack having a third gate dielectric layer wrapping around each of a third plurality of nanostructures,
      a second pull-down transistor including a fourth gate stack having a fourth gate dielectric layer wrapping around each of a fourth plurality of nanostructures,
   wherein the first gate dielectric layer is free of lanthanum and the second gate dielectric layer is doped with lanthanum such that the first memory cell operates at a first threshold voltage,
   wherein the third gate dielectric layer is doped with lanthanum and the fourth gate dielectric layer is free of lanthanum such that the second memory cell operates at a second threshold voltage, and the second threshold voltage is greater than the first threshold voltage.

2. The semiconductor memory chip of claim 1,
   wherein the first pull-up transistor and the second pull-up transistor are of p-type conductivity,
   wherein the first pull-down transistor and the second pull-down transistor are of n-type conductivity.

3. The semiconductor memory chip of claim 1,
   wherein the first memory cell further comprises a first pass-gate transistor having a fifth gate dielectric layer wrapping around each of a fifth plurality of nanostructures,
   wherein the second memory cell further comprises a second pass-gate transistor having a sixth gate dielectric layer wrapping around each of a sixth plurality of nanostructures,
   wherein the fifth gate dielectric layer is doped with lanthanum and the sixth gate dielectric layer is free of lanthanum, and the first pass-gate transistor and the second pass-gate transistor are of n-type conductivity.

4. The semiconductor memory chip of claim 1, wherein the first memory cell and the second memory cell have a same cell length along a first direction and a same cell width along a second direction perpendicular to the first direction.

5. The semiconductor memory chip of claim 1, wherein the second memory cell is connected to a write-assist circuit while the first memory cell is not connected to a write-assist circuit.

6. The semiconductor memory chip of claim 1, further comprising:
   a third memory cell comprising:

a third pull-up transistor including a fifth gate stack having a fifth gate dielectric layer wrapping around each of a fifth plurality of nanostructures,
a third pull-down transistor including a sixth gate stack having a sixth gate dielectric layer wrapping around each of a sixth plurality of nanostructures,
wherein the fifth gate dielectric layer is free of lanthanum and the sixth gate dielectric layer is doped with lanthanum such that the third memory cell operates at a third threshold voltage, and the second threshold voltage is greater than the third threshold voltage.

7. The semiconductor memory chip of claim 6,
wherein the first memory cell and the second memory cell have a first cell size, and the third memory cell has a second cell size,
wherein the second cell size is greater than the first cell size.

8. The semiconductor memory chip of claim 6,
wherein each of the sixth plurality of nanostructures in the third memory cell has a greater width along a first direction than each of the second plurality of nanostructures in the first memory cell along the first direction.

9. The semiconductor memory chip of claim 1,
wherein a threshold voltage of the first pull-down transistor is lower than a threshold voltage of the second pull-down transistor by at least 30 mV,
wherein a threshold voltage of the first pull-up transistor is lower than a threshold voltage of the second pull-up transistor by at least 30 mV.

10. The semiconductor memory chip of claim 1,
wherein the first, the second, the third, and the fourth gate stacks each includes a work function metal layer,
wherein the work function metal layer in the first gate stack is thicker than the work function metal layer in the second gate stack,
wherein the work function metal layer in the third gate stack is thinner than the work function metal layer in the fourth gate stack.

11. A semiconductor memory chip, comprising:
a first memory cell comprising:
  a first n-type transistor including a first gate stack having a first gate dielectric layer wrapping around each of a first plurality of nanostructures; and
a second memory cell comprising:
  a second n-type transistor including a second gate stack having a second gate dielectric layer wrapping around each of a second plurality of nanostructures,
wherein the first memory cell and the second memory cell have a same first cell length along a first direction and a same first cell width along a second direction perpendicular to the first direction,
wherein the first gate dielectric layer includes more lanthanum dopants than the second gate dielectric layer such that the first n-type transistor has a lower threshold voltage than the second n-type transistor.

12. The semiconductor memory chip of claim 11,
wherein the first and the second gate stacks each includes a work function metal layer,
wherein the work function metal layer in the first gate stack is thinner than the work function metal layer in the second gate stack.

13. The semiconductor memory chip of claim 11,
wherein a difference between a threshold voltage of the first n-type transistor and a threshold voltage of the second n-type transistor is between about 30 mV and about 120 mV.

14. The semiconductor memory chip of claim 11, further comprising:
a third memory cell comprising:
a third n-type transistor including a third gate stack having a third gate dielectric layer wrapping around each of a third plurality of nanostructures,
wherein the third gate dielectric layer includes more lanthanum dopants than the second gate dielectric layer such that the third n-type transistor has a lower threshold voltage than the second n-type transistor.

15. The semiconductor memory chip of claim 14,
wherein the third memory cell has a third cell length along the first direction and a third cell width along the second direction,
wherein the third cell length is greater than the same first cell length,
wherein the third cell width is about the same as the same first cell width.

16. The semiconductor memory chip of claim 14, wherein a difference between a threshold voltage of the first n-type transistor and a threshold voltage of the second n-type transistor is between about 30 mV and about 120 mV.

17. A semiconductor memory chip, comprising:
a first memory cell comprising:
  a first p-type transistor including a first gate stack having a first gate dielectric layer wrapping around each of a first plurality of nanostructures; and
a second memory cell comprising:
  a second p-type transistor including a second gate stack having a second gate dielectric layer wrapping around each of a second plurality of nanostructures,
wherein the first memory cell and the second memory cell have a same first cell length along a first direction and a same first cell width along a second direction perpendicular to the first direction,
wherein the first gate dielectric layer includes less lanthanum dopants than the second gate dielectric layer such that the first p-type transistor has a lower threshold voltage than the second p-type transistor.

18. The semiconductor memory chip of claim 17,
wherein the first and the second gate stacks each includes a work function metal layer,
wherein the work function metal layer in the first gate stack is thicker than the work function metal layer in the second gate stack.

19. The semiconductor memory chip of claim 17,
wherein a difference between a threshold voltage of the first p-type transistor and a threshold voltage of the second p-type transistor is between about 30 mV and about 120 mV.

20. The semiconductor memory chip of claim 17,
wherein the first memory cell further comprises a first n-type transistor including a third gate stack having a third gate dielectric layer wrapping around each of a third plurality of nano structures,
wherein the second memory cell further comprises a second n-type transistor including a fourth gate stack having a fourth gate dielectric layer wrapping around each of a fourth plurality of nanostructures,
wherein the third gate dielectric layer includes more lanthanum dopants than the fourth gate dielectric layer such that the first n-type transistor has a lower threshold voltage than the second n-type transistor.

* * * * *